US009437289B2

(12) United States Patent
Oh et al.

(10) Patent No.: US 9,437,289 B2
(45) Date of Patent: Sep. 6, 2016

(54) ELECTRONIC DEVICE

(71) Applicant: SK hynix Inc., Icheon-Si (KR)

(72) Inventors: Byoung-Chan Oh, Icheon-Si (KR);
Yoon-Jae Shin, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/219,381

(22) Filed: Mar. 19, 2014

(65) Prior Publication Data

US 2015/0049536 A1    Feb. 19, 2015

(30) Foreign Application Priority Data

Aug. 14, 2013    (KR) .................. 10-2013-0096436

(51) Int. Cl.
    G11C 13/00    (2006.01)
    G11C 11/16    (2006.01)
    G11C 7/04    (2006.01)

(52) U.S. Cl.
    CPC .............. *G11C 13/003* (2013.01); *G11C 7/04* (2013.01); *G11C 11/16* (2013.01); *G11C 11/1655* (2013.01); *G11C 11/1673* (2013.01); *G11C 11/1675* (2013.01); *G11C 11/1697* (2013.01); *G11C 13/0002* (2013.01); *G11C 13/0004* (2013.01); *G11C 13/004* (2013.01); *G11C 13/0007* (2013.01); *G11C 13/0026* (2013.01); *G11C 13/0038* (2013.01); *G11C 13/0069* (2013.01); *G11C 2213/74* (2013.01); *G11C 2213/78* (2013.01); *G11C 2213/79* (2013.01)

(58) Field of Classification Search
    CPC ............ G11C 13/003; G11C 13/0002; G11C 13/0004; G11C 13/0007; G11C 13/0026; G11C 13/0038; G11C 13/004; G11C 13/0069; G11C 11/1655; G11C 11/16; G11C 11/1673; G11C 11/1697; G11C 11/1675; G11C 7/04; G11C 2213/74; G11C 2213/78; G11C 2213/79
    USPC ......................................... 365/148, 145, 158
    See application file for complete search history.

(56) References Cited

U.S. PATENT DOCUMENTS

| 6,906,975 B2 * | 6/2005 | Kang .................... G11C 11/22 365/145 |
| 2007/0211512 A1 * | 9/2007 | Shuto ....................... G11C 7/04 365/145 |

(Continued)

FOREIGN PATENT DOCUMENTS

| KR | 10-2009-0027378 A | 3/2009 |
| KR | 10-2012-0086953 A | 8/2012 |

*Primary Examiner* — Alexander Sofocleous
*Assistant Examiner* — Sung Cho
(74) *Attorney, Agent, or Firm* — Perkins Coie LLP

(57) ABSTRACT

Provided an electronic device including a semiconductor memory unit. The semiconductor memory unit includes: a plurality of storage cells each including a variable resistance element of which resistance is changed in response to a current flowing across the variable resistance element and a selecting element coupled to one end of the variable resistance element; a plurality of word lines corresponding to the respective storage cells and each coupled to a selecting element of a corresponding storage cell; a first line coupled to one ends of the plurality of storage cells; a second line coupled to the other ends of the plurality of storage cells; a voltage adjuster configured to adjust the voltage levels of back bias voltages of the selecting elements of the plurality of storage cells; and an access control unit electrically coupled to the first and second lines and passing an access current to a selected storage cell among the plurality of storage cells.

18 Claims, 16 Drawing Sheets

(56) References Cited

U.S. PATENT DOCUMENTS

| | | | |
|---|---|---|---|
| 2009/0273961 A1* | 11/2009 | Ono | G11C 7/18 365/51 |
| 2010/0091562 A1* | 4/2010 | Chen | G11C 7/04 365/171 |
| 2012/0140545 A1* | 6/2012 | Kim | G11C 7/04 365/148 |
| 2012/0170360 A1* | 7/2012 | Yoon | G11C 7/04 365/163 |
| 2014/0016404 A1* | 1/2014 | Kim | G11C 11/165 365/158 |
| 2014/0098600 A1* | 4/2014 | Kim | G11C 11/1695 365/158 |
| 2014/0101371 A1* | 4/2014 | Nguyen | G06F 3/0616 711/103 |
| 2014/0136600 A1* | 5/2014 | Kao | G06F 17/30197 709/203 |
| 2014/0146600 A1* | 5/2014 | Sohn | G11C 11/1697 365/158 |
| 2014/0286081 A1* | 9/2014 | Takahashi | G11C 13/004 365/148 |
| 2015/0162056 A1* | 6/2015 | Gupta | G11C 16/08 365/203 |

* cited by examiner $\triangle R_{VAR} > \triangle R_T + \triangle R_{L1} + \triangle R_{L2}$ $\triangle R_{VAR} = \triangle R_T + \triangle R_{L1} + \triangle R_{L2}$ $\triangle R_{VAR} = \triangle R_T + \triangle R_{L1} + \triangle R_{L2} + \triangle R_{TR1} + \triangle R_{TR2} + \triangle R_{GL1} + \triangle R_{GL2}$

ELECTRONIC DEVICE

CROSS-REFERENCE TO RELATED APPLICATIONS

The present application claims priority of Korean Patent Application No. 10-2013-0096436, entitled "ELECTRONIC DEVICE," and filed on Aug. 14, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device. An electronic device disclosed in this patent document can be used to provide an optimized access current to a storage cell regardless of temperature when the storage cell is accessed and thus can precisely perform an access operation on a storage cell.

In one aspect, an electronic device is provided to include a semiconductor memory that includes: a plurality of storage cells each comprising a variable resistance element of which resistance value changes with a current flowing across the variable resistance element and a selecting element coupled to one end of the variable resistance element; a plurality of word lines, each coupled to a selecting element of a corresponding storage cell of the plurality of storage cells; a first line coupled to one ends of the plurality of storage cells; a second line coupled to the other ends of the plurality of storage cells; a voltage adjuster configured to adjust the voltage levels of back bias voltages of the selecting elements of the plurality of storage cells in accordance with a temperature change; and an access control unit electrically coupled to the first and second lines and providing an access current to a selected storage cell among the plurality of storage cells.

In some implementations, the access control unit applies a set voltage between the first and second lines so as to pass the access current to the selected storage cell, during an access operation.

In some implementations, the variable resistance element is either a first state in which the variable resistance element has a first resistance value or a second state in which the variable resistance element has a second resistance value higher than the first resistance value, and the access current may include a write current for changing the state of the variable resistance element or a read current for detecting the state of the variable resistance element.

In some implementations, the write current flows in a direction set by input data, and the read current flows in a set direction.

In some implementations, when the temperature increases, a switching current corresponding to a minimum current to change the state of the variable resistance element decreases, resistance of the variable resistance element decreases, resistance of the selecting element increases, and resistances of the first and second lines increase.

In some implementations, when the decrease in resistance of the variable resistance element according to the increase of temperature is smaller than the sum of the increase in resistance of the selecting element according to the increase of temperature, the increase in resistance of the first line according to the increase of temperature, and the increase in resistance of the second line according to the increase of temperature, the write current and the read current decrease with the increase of temperature.

In some implementations, the voltage adjuster increases the back bias voltage when the temperature increases during a write operation in case where the decrease of the switching current according to the increase of temperature is smaller than the decrease of the write current according to the increase of temperature.

In some implementations, the voltage adjuster increases the back bias voltage when the temperature decreases during the write operation in case where the decrease of the switching current according to the increase of temperature is larger than the decrease of the write current according to the increase of temperature.

In some implementations, the voltage adjuster maintains the back bias voltage at a set voltage level during the write operation in case where the decrease of the switching current according to the increase of temperature is equal to the decrease of the write current according to the increase of temperature.

In some implementations, the voltage adjuster increases the back bias voltage when the temperature increases during a read operation.

In some implementations, the electronic device may further include a word line control unit configured to activate the selected word line among the plurality of word lines, and adjust an activation voltage applied to the selected word line according to the temperature.

In some implementations, the word line control unit increases the activation voltage when the temperature increases during a write operation in case where a decrease of the switching current according to the increase of temperature is smaller than a decrease of the write current according to the increase of temperature.

In some implementations, the word line control unit increases the activation voltage when the temperature decrease during the write operation in case where the decrease of the switching current according to the increase of temperature is larger than the decrease of the write current according to the increase of temperature.

In some implementations, the word line control unit maintains the activation voltage at a set voltage level during the write operation in case where the decrease of the switching current according to the increase of temperature is equal to the decrease of the write current according to the increase of temperature.

In some implementations, the word line control unit increases the activation voltage when the temperature increases during a read operation.

In some implementations, when the decrease in resistance of the variable resistance element according to the increase of temperature is larger than the sum of the increase in resistance of the selecting element according to the increase of temperature, the increase in resistance of the first line according to the increase of temperature, and the increase in resistance of the second line according to the increase of temperature, the write current and the read current increase with the increase of temperature.

In some implementations, the voltage adjuster increases the back bias voltage with the decrease of temperature.

In some implementations, the electronic device may further include a word line control unit configured to activate the selected word line among the plurality of word line, and adjust an activation voltage applied to the selected word line according to the temperature, and the word line control unit increases the activation voltage with the decrease of temperature.

In some implementations, when the decrease in resistance of the variable resistance element according to the increase of temperature is equal to the sum of the increase in resistance of the selecting element according to the increase of temperature, the increase in resistance of the first line according to the increase of temperature, and the increase in resistance of the second line according to the increase of temperature, the write current and the read current are maintained at set values.

In some implementations, the voltage adjuster increases the back bias voltage when the temperature decreases during a write operation, and maintains the back bias voltage at a set voltage level during a read operation.

In some implementations, the electronic device may further include a word line control unit configured to activate the selected word line among the plurality of word lines and adjust an activation voltage applied to the selected word line according to the temperature, and the word line control unit increases the activation voltage when the temperature decreases during a write operation, and maintains the activation voltage at a set voltage level during a read operation.

In some implementations, the variable resistance element includes one or more of a metal oxide, a phase change material, and a structure having a tunnel barrier layer interposed between two magnetic layers.

In some implementations, the electronic device further includes a temperature sensor that senses a temperature of the semiconductor memory to produce a temperature output signal indicating the sensed temperature, and the access control unit and the voltage adjuster operate to respond to the temperature output signal from the temperature sensor to cause a change in a switching current corresponding to a minimum current to change the state of the variable resistance element.

In some implementations, the voltage adjustor adjusts the voltage levels depending on a relationship between a change in the resistance value of the variable resistance element and a sum of changes in resistance values of the selecting element, the first line, the second line caused by a change in the temperature.

In some implementations, the voltage adjustor operates to increase the back bias voltage or maintain the back bias voltage.

In some implementations, the electronic device further includes a word line control unit that adjusts an activation voltage applied to the selected word line based on the temperature change, and the word line control unit operates to increase the activation voltage or maintains the activation voltage.

In some implementations, the variable resistance element includes a tunnel barrier layer interposed between two magnetic layers.

In some implementations, when the temperature increases, a switching current corresponding to a minimum current to change the state of the variable resistance element decreases, a resistance value of the variable resistance element decreases, resistance values of the selecting element, the first and second lines increase.

In some implementations, the voltage adjustor adjusts the voltage levels depending on a relationship between the change in the switching current between a change in the access current caused by the changes in resistance values of the variable resistance element, the selecting element, the first and second lines, and the voltage adjustor operates to increase the back bias voltage or maintain the back bias voltage.

In some implementations, the electronic device further includes a word line control unit that adjusts an activation voltage applied to the selected word line depending on a relationship between the change in the switching current between a change in the access current caused by the changes in resistance values of the variable resistance element, the selecting element, the first and second lines.

In another aspect, an electronic device is provided to include a semiconductor memory that includes: a first global line; a second global line; a plurality of cell arrays each including a plurality of storage cells including a selecting element, a first line coupled to one ends of the plurality of storage cells, and a second line coupled to the other ends of the plurality of storage cells; a plurality of word lines, each coupled to a selecting element of a corresponding storage cell; a plurality of first transistors connected to the first global line and the respective cell arrays; a plurality of second transistors connected to the second global line and the respective cell arrays; a voltage adjuster configured to adjust the voltage levels of back bias voltages of the selecting elements, the plurality of first transistors, and the plurality of second transistors in accordance with a temperature change; and an access control unit configured to provide an access current to a selected storage cell among the plurality of storage cells.

In some implementations, each cell array includes a variable resistance element of which resistance changes based on a current flowing across the variable resistance element.

In some implementations, the access control unit applies a set voltage between the first and second lines so as to pass the access current to the selected storage cell, during an access operation.

In some implementations, the variable resistance element is in either a first state in which the variable resistance element has a first resistance value or a second state in which the variable resistance element has a second resistance value higher than the first resistance value.

In some implementations, the access current includes a write current for changing the state of the variable resistance element or a read current for detecting the state of the variable resistance element.

In some implementations, when the temperature increases, a switching current corresponding to a minimum current to change the state of the variable resistance element decreases, resistance of the variable resistance element decreases, resistance of the selecting element increases, resistances of the plurality of first and second transistors increase, resistances of the first and second lines increase, and resistances of the first and second global lines increase.

In some implementations, when the decrease in resistance of the variable resistance element according to the increase of temperature is smaller than the sum of the increase in resistance of the selecting element according to the increase of temperature, the increase in resistance of the first transistors according to the increase of temperature, the increase in resistance of the second transistors according to the increase of temperature, the increase in resistance of the first line according to the increase of temperature, the increase in resistance of the second line according to increase of temperature, the increase in resistance of the first global line according to the increase of temperature, and the increase in resistance of the second global line according to the increase of temperature, the write current and the read current decrease with the increase of temperature.

In some implementations, the voltage adjuster increases the back bias voltage when the temperature increases during a write operation in case where the decrease of the switching current according to the increase of temperature is smaller than the decrease of the write current according to the increase of temperature.

In some implementations, the voltage adjuster increases the back bias voltage when the temperature decreases during the write operation in case where the decrease of the switching current according to the increase of temperature is larger than the decrease of the write current according to the increase of temperature.

In some implementations, the voltage adjuster maintains the back bias voltage at a set voltage level during the write operation in case where the decrease of the switching current according to the increase of temperature is equal to the decrease of the write current according to the increase of temperature.

In some implementations, the voltage adjuster increases the back bias voltage when the temperature increases during a read operation.

In some implementations, the electronic device may further include a word line control unit configured to activate the selected word line among the plurality of word lines, and configured to adjust an activation voltage applied to the selected word line according to the temperature.

In some implementations, the word line control unit increases the activation voltage when the temperature increases during a write operation in case where the decrease of the switching current according to the increase of temperature is smaller than the decrease of the write current according to the increase of temperature.

In some implementations, the word line control unit increases the activation voltage when the temperature decreases during the write operation in case where the decrease of the switching current according to the increase of temperature is larger than the decrease of the write current according to the increase of temperature.

In some implementations, the word line control unit maintains the activation voltage at a set voltage level during the write operation in case where the decrease of the switching current according to the increase of temperature is equal to the decrease of the write current according to the increase of temperature.

In some implementations, the word line control unit increases the activation voltage when the temperature increases during a read operation.

In some implementations, the electronic device may further include a select signal generator configured to generate a plurality of select signals corresponding to the respective cell arrays, activate one or more of the plurality of select signals, and adjust the voltage levels of the activated select signals according to the temperature.

In some implementations, the select signal generator increases the voltage level of the activated select signal when the temperature increases during a write operation in case where the decrease of the switching current according to the increase of temperature is smaller than the decrease of the write current according to the increase of temperature.

In some implementations, the select signal generator increases the voltage level of the activated select signal when the temperature decreases during the write operation in case where the decrease of the switching current according to the increase of temperature is larger than the decrease of the write current according to the increase of temperature.

In some implementations, the select signal generator maintains the voltage level of the activated select signal at a set level during the write operation in case where the decrease of the switching current according to the increase of temperature is equal to the decrease of the write current according to the increase of temperature.

In some implementations, the select signal generator increases the voltage level of the activated select signal when the temperature increases during a read operation.

In some implementations, when the decrease in resistance of the variable resistance element according to the increase of temperature is larger than the sum of the increase in resistance of the selecting element according to the increase of temperature, the increase in resistance of the first transistors according to the increase of temperature, the increase in resistance of the second transistors according to the increase of temperature, the increase in resistance of the first line according to the increase of temperature, the increase in resistance of the second line according to increase of temperature, the increase in resistance of the first global line according to the increase of temperature, and the increase in resistance of the second global line according to the increase of temperature, the write current and the read current increase with the increase of temperature.

In some implementations, the voltage adjuster increases the back bias voltage with the decrease of temperature.

In some implementations, the electronic device may further include a word line control unit configured to activate the selected word line among the plurality of word lines and adjust an activation voltage applied to the selected word line according to the temperature.

In some implementations, the word line control unit increases the activation voltage with the decrease of temperature.

In some implementations, the electronic device may further include a select signal generator configured to generate a plurality of select signals corresponding to the respective cell arrays, activate one or more of the plurality of select signals, and adjust the voltage levels of the activated select signals according to the temperature.

In some implementations, the select signal generator increases the voltage level of the activated select signal with the decrease of temperature.

In some implementations, when the decrease in resistance of the variable resistance element according to the increase of temperature is equal to the sum of the increase in resistance of the selecting element according to the increase of temperature, the increase in resistance of the first transistors according to the increase of temperature, the increase in resistance of the second transistors according to the increase of temperature, the increase in resistance of the first line according to the increase of temperature, the increase in resistance of the second line according to increase of temperature, the increase in resistance of the first global line according to the increase of temperature, and the increase in resistance of the second global line according to the increase of temperature, the write current and the read current are maintained at set values.

In some implementations, the voltage adjuster increases the back bias voltage with the decrease of temperature.

In some implementations, the electronic device may further include a word line control unit configured to activate the selected word line among the plurality of word lines, and adjust the voltage level of an activation voltage applied to the selected word line according to the temperature.

In some implementations, the word line control unit increases the activation voltage with the decrease of temperature.

In some implementations, the electronic device may further include a select signal generator configured to generate a plurality of select signals corresponding to the respective cell arrays, activate one or more of the plurality of select signals, and adjust the voltage levels of the activated select signals according to the temperature.

In some implementations, the select signal generator increases the voltage level of the activated select signal when the temperature decreases during a write operation, and maintains the voltage level of the activated select signal at a set level during a read operation.

In some implementations, the electronic device may further include: a temperature sensor that senses a temperature of the semiconductor memory to produce a temperature output signal indicating the sensed temperature, and wherein the access control unit and the voltage adjuster operate to respond to the temperature output signal from the temperature sensor to cause the electrical characteristics of elements of the semiconductor memory to change.

In some implementations, the voltage adjustor adjusts the voltage levels depending on a relationship between the change in the resistance value of the variable resistance element and the sum of the changes in resistance values of the selecting element, the first transistors, the second transistors, the first line, the second line, the first global line, the second global line, the write current and the read current, when the changes in the resistance values are caused by the temperature change.

In some implementations, the voltage adjuster operates to increase the back bias voltage or maintain the back bias voltage.

In some implementations, the electronic device may further include a word line control unit configured to activate the selected word line among the plurality of word lines, and configured to adjust an activation voltage applied to the selected word line in accordance with the temperature change, and the word line control unit operates to increase or maintain the activation voltage.

In some implementations, the electronic device may further include a select signal generator configured to generate a plurality of select signals for the respective cell arrays, activate one or more of the plurality of select signals, and adjust the voltage levels of the activated select signals in accordance with the temperature change, and the select signal generator operates to increase or maintain the voltage level of the activated select signal.

In some implementations, the variable resistance element includes a structure having a tunnel barrier layer interposed between two magnetic layers.

In some implementations, when the temperature increases, a switching current corresponding to a minimum current to change the state of the variable resistance element decreases, a resistance value of the variable resistance element decreases, resistance values of the selecting element the first and second transistors, the first and second lines increase, and the first and second global lines increase.

In some implementations, the voltage adjustor adjusts the voltage levels depending on a relationship between the change in the switching current between a change in the access current caused by the changes in resistance values of the variable resistance element, the selecting element the first and second transistors, the first and second lines increase, and the first and second global lines.

In some implementations, the electronic device further includes a word line control unit configured to activate the selected word line among the plurality of word lines, and configured to adjust an activation voltage applied to the selected word line depending on a relationship between the change in the switching current between a change in the access current caused by the changes in resistance values of the variable resistance element, the selecting element the first and second transistors, the first and second lines increase, and the first and second global lines, wherein the word line control unit operates to increases or maintain the activation voltage.

In implementations, the electronic device further includes a select signal generator configured to generate a plurality of select signals for the respective cell arrays, activate one or more of the plurality of select signals, and adjust the voltage levels of the activated select signals depending on a relationship between the change in the switching current between a change in the access current caused by the changes in resistance values of the variable resistance element, the selecting element the first and second transistors, the first and second lines increase, and the first and second global lines, wherein the select signal generator operates to increase or maintain the voltage level of the activated select signal.

In another aspect, an electronic device is provided to include a semiconductor memory that includes: a plurality of memory cells, each memory cell including a variable resistance element having two different states for storing data in the variable resistance element, a selecting element coupled to the variable resistance element, and a word line coupled to the selecting element to turn on the selecting element; a temperature sensor that senses a temperature of the semiconductor memory to produce a temperature output signal indicating the sensed temperature; and a voltage control unit adjusting voltage levels applied to at least one of plurality of the memory cells in response to a change in the temperature of the semiconductor memory based on the temperature output signal to cause a change in electrical characteristics of the memory cells to optimize an operation of the memory cells.

In some implementations, the voltage levels adjusted include the voltage level of a back bias voltage applied to a selecting element and the voltage level of an activation voltage applied to a word line.

In some implementations, the electronic device may further include: an access control unit providing access currents to a selected memory cell via a pair of lines respectively coupled to both ends of the plurality of memory cells, and the access current is a write current for changing the state of the variable resistance element of the selected memory cell when the access operation is a write operation or a read current for determining the state of the variable resistance element when the access operation is a read operation.

In some implementations, the voltage control unit adjusts the voltage levels during the write operation based on the change of the switching current in accordance with a temperature change and adjusts the voltage levels during the read operation based on the change of the resistance value of the variable resistance element in accordance with the temperature change.

In some implementations, the voltage control unit operates to increase the voltage levels in accordance with the increase of the temperature, increase the voltage levels in accordance with the decrease of the temperature, or maintain the voltage levels.

In another aspect, an electronic device is provided to include a semiconductor memory that includes: a plurality of cell arrays, each cell including a plurality of memory cells, and each memory cell including a variable resistance element having two different states for storing data in the variable resistance element, a selecting element coupled to the variable resistance element, and a word line coupled to the selecting element to turn on the selecting element; and a plurality of first and second transistors, the first transistors and the second transistors coupled to both terminals of the plurality of cell arrays, respectively; a voltage control unit adjusting voltage levels applied to at least one of the plurality of the memory cells and voltage levels applied to at least one of the plurality of first and second transistors based on the changes of the electrical characteristics of elements of a memory cell that are caused by a temperature change.

In some implementations, the electrical device may further include: a select signal generator providing a select signal to select a cell array and adjusting voltage level of the select signal based on the temperature change.

In some implementations, the voltage levels adjusted include the voltage level of a back bias voltages applied to a selecting element and the voltage level of an activation voltages applied to a word line.

In some implementations, the voltage control unit operates to increase the voltage levels in accordance with the increase of the temperature, increase the voltage levels in accordance with the decrease of the temperature, or maintain the voltage levels.

In yet another aspect, a method for operating an electronic device is provided. The method may include: providing a plurality of memory cells, each memory cell including a variable resistance element having two different states for storing different data in the variable resistance element, a selecting element coupled to the variable resistance element, and a word line coupled to the selecting element; controlling voltage levels applied to at least one of the plurality of memory cells such that a write current for changing the state of the variable resistance element and a read current for determining the state of the variable resistance element are optimized to provide a sufficient process margin over a wide range of a temperature.

In some implementations, the controlling of the voltage levels is performed such that the write current has a greater difference from a switching current that is the minimum current to change the state of the variable resistance element and that the read current has a greater difference from the reference current that is set as the reference for determining the state of the variable resistance element.

In some implementations, the controlling of the voltage levels including increasing the voltage levels increase the voltage levels in accordance with the increase of the temperature, increasing the voltage levels in accordance with the decrease of the temperature, or maintaining the voltage levels.

In some implementations, the variable resistance element may include at least one among a metal oxide, a phase change substance and a structure in which a tunnel barrier layer is interposed between two ferromagnetic layers.

In some implementations, the electronic device further includes a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device further includes a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device further includes a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device further includes a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device further includes a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

BRIEF DESCRIPTION OF THE DRAWINGS

Various examples and implementations of the disclosed technology are described below in detail with reference to the accompanying drawings.

DETAILED DESCRIPTION

Various examples and implementations of the disclosed technology are described below in detail with reference to the accompanying drawings.

A semiconductor device in accordance with the present implementations may include a variable resistance element-variable resistance element. The variable resistance element-variable resistance element may exhibit a variable resistance characteristic, and include a single layer or multilayer. For example, the variable resistance elementvariable resistance element may include a material used in RRAM, PRAM, MRAM, FRAM and the like, such as a chalcogenide-based compound, a transition metal compound, a ferroelectric material, or a ferromagnetic material. However, other implementations are possible as long as the variable resistance elementvariable resistance element has a variable resistance characteristic of switching between different resistance states depending on a voltage or current applied across the variable resistance elementvariable resistance element.

More specifically, the variable resistance elementvariable resistance element may include metal oxide. The metal oxide may include a transition metal oxide such as nickel oxide, titanium oxide, hafnium oxide, zirconium oxide, tungsten oxide, or cobalt oxide and a perovskite-based material such as STO (SrTiO) or PCMO (PrCaMnO). Such a variable resistance elementvariable resistance element may exhibit a characteristic of switching between different resistance states through formation or removal of a current filament caused by behavior of vacancies.

Furthermore, the variable resistance elementvariable resistance element may include a phase change material. The phase change material may include a chalcogenide-based material such as GST (Ge—Sb—Te), for example. The variable resistance elementvariable resistance element is stabilized to either a crystalline state or an amorphous state by heat, thereby switching between different resistance states.

Furthermore, the variable resistance elementvariable resistance element may include a structure having a tunnel barrier layer interposed between two magnetic layers. The magnetic layer may be formed of NiFeCo or CoFe, and the tunnel barrier layer may be formed of $Al_2O_3$. The variable resistance elementvariable resistance element may exhibit a characteristic of switching between different resistance states according to the magnetization direction of the magnetic layer. For example, the variable resistance element-variable resistance element may have a low-resistance state when the magnetization directions of the two magnetic layers are parallel to each other, and may have a high-resistance state when the magnetization directions of the two magnetic layers are anti-parallel to each other.

Figure 1:
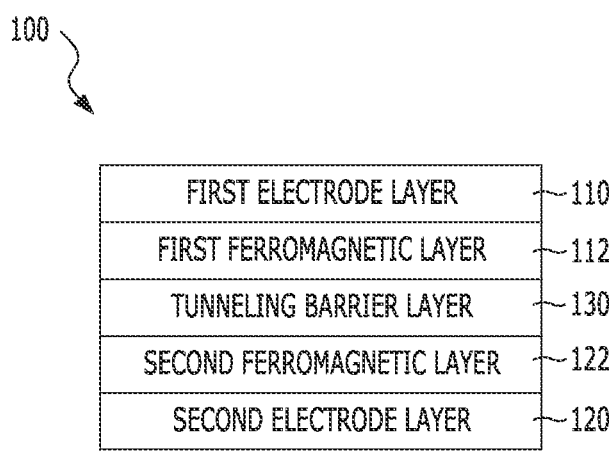
FIG. 1 is a diagram illustrating an implementation of a magnetic tunnel junction (MTJ) including a tunnel barrier layer interposed between two magnetic layers.

FIG. 1 is a diagram illustrating an implementation of a magnetic tunnel junction (MTJ) element including a tunnel barrier layer interposed between two magnetic layers.

As illustrated in FIG. 1, the MTJ element 100 includes a first electrode layer 110 serving as a top electrode, a second electrode layer 120 serving as a bottom electrode, a pair of first and second magnetic layers 112 and 122, and a tunnel barrier layer 130 formed between the pair of the first and second magnetic layers 112 and 122.

The first magnetic layer 112 may include a free ferromagnetic layer of which the magnetization direction is varied according to the direction of a current applied to the MTJ element 100, and the second magnetic layer 122 may include a pinned ferromagnetic layer of which the magnetization direction is pinned.

The MTJ element 100 operates to store data "0" or "1" as the resistance value is changed to a low value or a high value, respectively, according to the direction of the current.

Figure 2A:
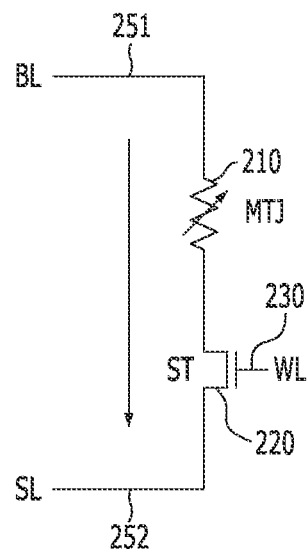
FIGS. 2A and 2B are diagrams for explaining the principle of storing data in a variable resistance elementvariable resistance element.
Figure 2B:
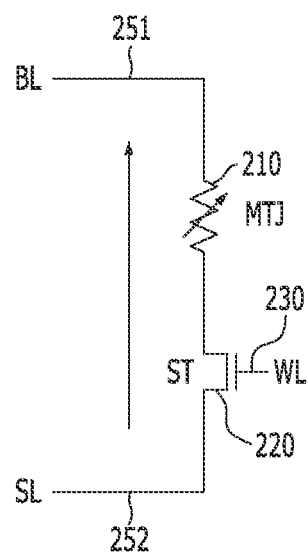

FIGS. 2A and 2B are diagrams of two examples of circuit operation configurations where a variable resistance elementvariable resistance element 210 exhibits two different resistance values for explaining how data is stored in a variable resistance elementvariable resistance element 210. The variable resistance elementvariable resistance element 210 exhibits two different resistance values when the current is directed in it is in two opposite directions and may include the MTJ element 100 described with reference to FIG. 1 to achieve this property.

FIG. 2A is a diagram for explaining the principle that a low data value is stored in the variable resistance elementvariable resistance element 210. In order to select the variable resistance elementvariable resistance element 210 for storing data, a word line 230 coupled to the variable resistance elementvariable resistance element 210 is activated to turn on a transistor 220. Consider the situation where a current flows from one end 251 toward the other end 252, that is, from the first electrode layer 110 as the top electrode to the second electrode layer 120 as the bottom electrode of the MTJ element 100 in FIG. 1 as indicated by the arrow direction. In this case, the magnetization direction of the first magnetic layer 110 as the free magnetic layer becomes parallel to the magnetization direction of the second magnetic layer 122 as the pinned magnetic layer, and the variable resistance elementvariable resistance element 210 has a low resistance state, representing a low data value stored in the variable resistance elementvariable resistance element 210.

FIG. 2B is a diagram for explaining the principle that a high data value is stored in the variable resistance elementvariable resistance element 210. The word line 230 coupled to the variable resistance elementvariable resistance element 210 is activated to turn on the transistor 220. When a current flows from the one end 252 to the other end 251, that is, from the second electrode layer 120 to the first electrode layer 110 as indicated by the arrow, the magnetization direction of the first magnetic layer 112 becomes anti-parallel to the magnetization direction of the second magnetic layer 122. Under this condition, the variable resistance elementvariable resistance element 210 has a high resistance state, representing a high data value stored in the variable resistance elementvariable resistance element 210.

The logic value of the data stored in the variable resistance elementvariable resistance element 210 differs depending on the resistance value of the variable resistance elementvariable resistance element 210. When there exists a large difference in resistance value between the resistance value of the variable resistance elementvariable resistance element 210 in the high resistance state and the resistance value of the variable resistance elementvariable resistance element 210 in the low resistance state, it becomes easy to determine the data stored in the variable resistance elementvariable resistance element 210 by discriminating two different logic states with a high accuracy based on the two significantly different resistance values. When the difference in resistance value the high resistance state and the low resistance state is small, it becomes difficult to determine the data stored in the variable resistance elementvariable resistance element 210 because an error is more or highly likely to occur during the data determination when the two different resistance values are not significantly different from each other. Therefore, there is a demand or need for a technique capable of precisely determining data stored in the variable resistor even though there exists a small difference in resistance values between the high resistance state and the low resistance state of the variable resistance elementvariable resistance element 210.

Figure 3:
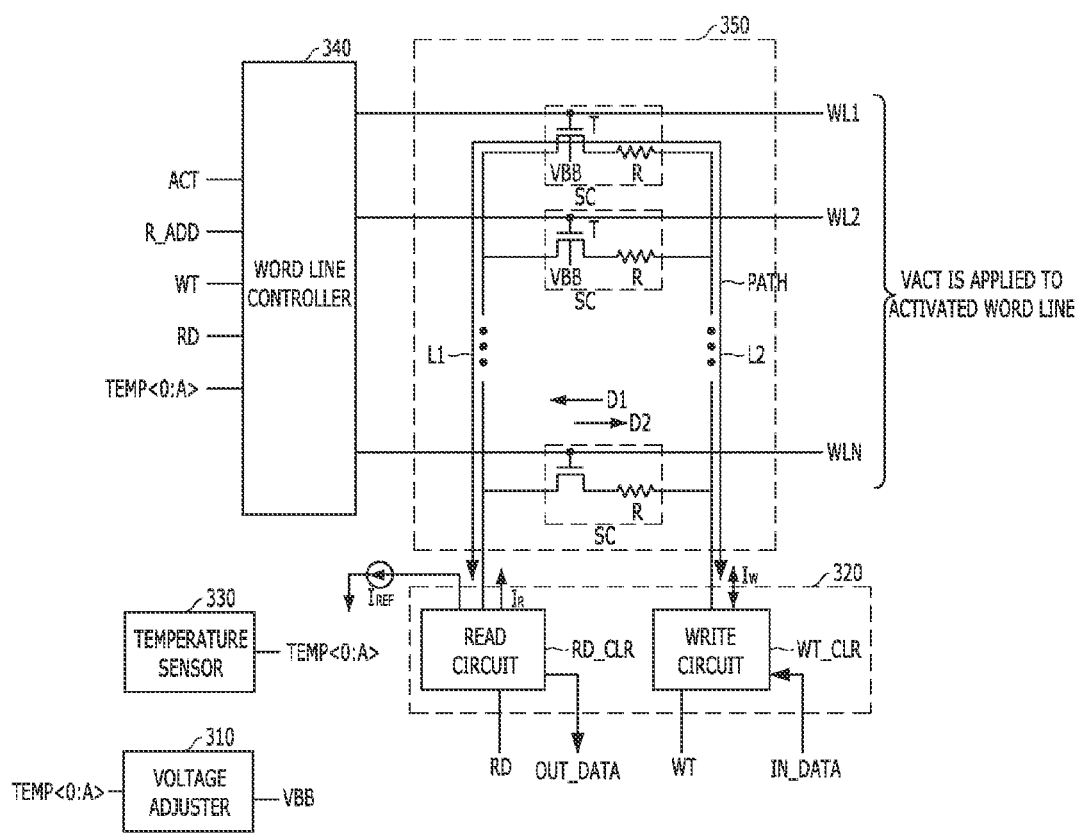
FIG. 3 is an example of a configuration diagram of a memory circuit (device) including a variable resistance elementvariable resistance element.
Figure 6:
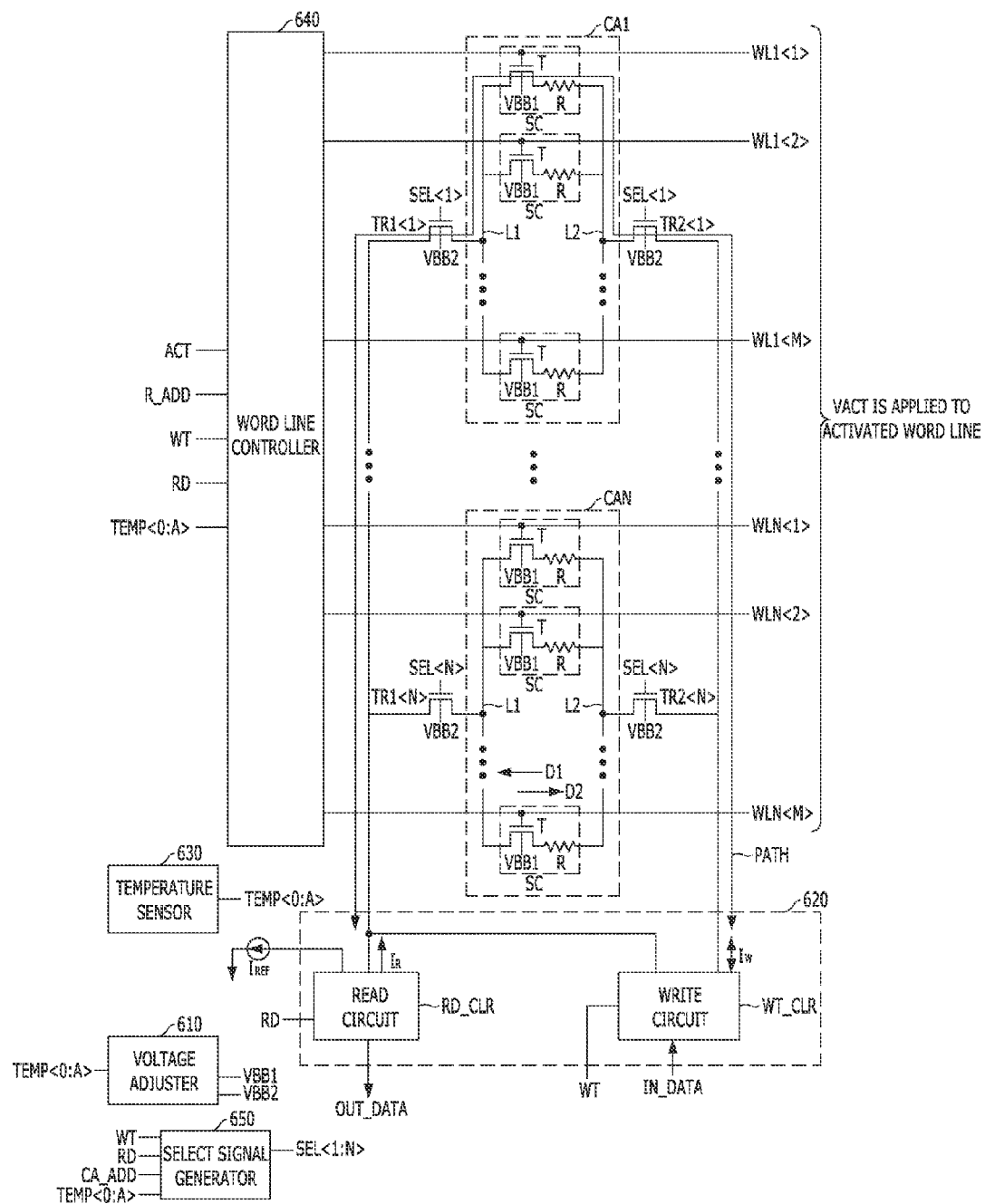
FIG. 6 is an example of a configuration diagram of a memory circuit or device including a variable resistance elementvariable resistance element.

FIGS. 3 and 6 illustrate examples of various implementations of a memory circuit or device having the above-described variable resistance elementvariable resistance element.

FIG. 3 is an example of a configuration diagram of a memory circuit or device including a variable resistance elementvariable resistance element. FIG. 3 illustrates a simplified configuration in order to easily explain the principle for optimizing a current flow in the variable resistance elementvariable resistance element according to the temperature at the variable resistance elementvariable resistance element.

Referring to FIG. 3, the memory circuit includes a plurality of storage cells SC as part of a cell array 350, a plurality of word lines WL1 to WLN, a first line L1, a second line L2, a voltage adjuster 310, and an access control unit 320. Each of the storage cells SC includes a variable resistance elementvariable resistance element R that can changes its resistance value in response to a current flow across the variable resistance elementvariable resistance element R and a selecting element T that is coupled to one end of the variable resistance elementvariable resistance element R and is used as a switch for activating (i.e., selecting) or de-activating (i.e., de-selecting) the variable resistance elementvariable resistance element. Each of the word lines WL1 to WLN is coupled to the selecting element T of a corresponding storage cell among the plurality of storage cells SC. The first line L1 is coupled to one ends of the plurality of storage cells SC. The second line L2 is coupled to the other ends of the plurality of storage cells SC. The voltage adjuster 310 is provided and configured to adjust the voltage levels of back bias voltages VBB of the selecting elements T of the plurality of storage cells SC according to a temperature during an access operation. The access control unit 320 is electrically coupled to the first and second lines L1 and L2, and configured to provide an access current to a selected storage cell among the plurality of storage cells SC during an access operation.

The memory circuit further includes a temperature sensor 330 and a word line control unit 340 for controlling and operating the cell array 350. The temperature sensor 330 is provided and configured to sense or measure the temperature of the memory circuit and generate a signal of the temperature information TEMP<0:A> indicating the measured temperature of the memory circuit and the variable resistance elementvariable resistance element R. The word line control unit 340 is provided and configured to activate a selected word line among the plurality of word lines WL1 to WLN in response to a row address R_ADD, when an active operation signal ACT is applied, and to control the voltage level of an activation voltage VACT applied to the selected word line in response to the temperature information TEMP<0:A>. The selecting element T included in each storage cells SC is coupled to a corresponding word line among the plurality of word lines WL1 to WLN.

The operation of the memory circuit in FIG. 3 in one implementation is described as follows.

The variable resistance elementvariable resistance element R may have a first state having a first resistance value and a second state having a second resistance value. The first state may correspond to the above-described low resistance state, and the second state may correspond to the above-described high resistance state. The first state of the variable resistance elementvariable resistance element R may be defined as a state in which a low data state or logic state (e.g., "0") is stored, and the second state of the variable resistor R may be defined as a state in which a high data or logic state value (e.g., "1") is stored. Alternatively, the first state of the variable resistance element variable resistance element R may be defined as a state in which a high data state is stored, and the second state of the variable resistance element variable resistance element R may be defined as a state in which a low data or logic state value is stored.

The electrical properties of the components of the memory circuit may change with the temperature. For example, the variable resistance element variable resistance element R, the selecting element T, the first line L1, and the second line L2, which are included in the storage cell SC may change their electrical characteristics with a change in temperature. More specifically, as the temperature increases, a switching current $I_{SW}$ corresponding to a minimum current to change the state of the variable resistance element variable resistance element R decreases, the resistance value $R_{VAR}$ of the variable resistance element variable resistance element R decreases, the resistance value $R_T$ of the selecting element T increases, and resistance values $R_{L1}$ and $R_{L2}$ of the first and second line L1 and L2 increase. The resistance value $R_T$ of the selecting element T indicates the resistance value of an equivalent resistance element corresponding to the selecting element T. The changes in electrical characteristics of the components of the memory circuit may affect the operation of the memory circuit.

The temperature sensor 330 senses the temperature of a specific portion of the memory circuit, and provides temperature information TEMP<0:A> based on the sensed temperature. For example, the specific portion of the memory circuit of which temperature is detected by the temperature sensor 330 may include the cell array 350 or a portion adjacent to the cell array 350. The temperature information TEMP<0:A> may include a one-bit or multi-bit digital signal.

The voltage adjuster 310 adjusts a back bias voltage VBB applied to the selecting element T in response to or based on the temperature information TEMP<0:A>. When the back bias voltage VBB of the selecting element T is adjusted, the resistance value $R_T$ of the selecting element T changes. More specifically, when the back bias voltage VBB increases, the resistance value $R_T$ of the selecting element T decreases. On the other hand, when the back bias voltage VBB decreases, the resistance value $R_T$ of the selecting element T increases. Additional details on the operation of the voltage adjuster 310 will be described below in detail with reference to FIG. 5.

The word line control unit 340 is configured to activate a word line selected by using the row address R_ADD among the plurality of word lines WL1 to WLN, when the active operation signal ACT is applied. When the activation voltage VACT is applied to the selected word line, the selected word line is activated. Once the word line is activated, the selecting element T coupled to the word line is turned on to provide a current to the variable resistance element variable resistance element R such that the storage cell SC becomes ready to be accessed. The word line control unit 340 adjusts the activation voltage VACT in response to or based on the temperature information TEMP<0:A>. As the activation voltage VACT increases, the selecting element T is strongly turned on to provide a large amount of a current to flow through the variable resistance element variable resistance element R, and as the activation voltage VACT decreases, the selecting element T is weakly turned on to provide a small amount of the current that flows through the variable resistance element variable resistance element R. Additional details on the operation of the word line control unit 340 will be described below in detail with reference to FIG. 5.

The access control unit 320 is coupled to the first and second lines L1 and L2, and provides an access current to the selected storage cell SC in response to an access command WT or RD during an access operation. The access control unit 320 may apply a predetermined voltage between the first and second lines L1 and L2 so as to provide an access current to the selected storage cell SC during the access operation.

The access control unit 320 provides a write current $I_W$ for changing the state of the variable resistance element variable resistance element R of the selected storage cell SC when the access operation is a write operation, and supplies a read current $I_R$ for detecting the state of the variable resistance element variable resistance element R when the access operation is a read operation. The flow direction of the write current $I_W$ is set according to input data IN_DATA, and the read current $I_R$ flows in a set or predetermined direction.

For the above-described operation, the access control unit 320 includes a write circuit WT_CIR and a read circuit RD_CIR. The write circuit WT_CIR is configured to to provide the write current $I_W$ in a direction which is set according to the input data IN_DATA of the selected storage cell SC in response to the write operation signal WT. For example, the write circuit WT_CIR provides the write current $I_W$ in a first direction D1 when the input data IN_DATA is low data, and provides the write current $I_W$ in a second direction D2 when the input data IN_DATA is high data. At this time, the write current $I_W$ may have a greater magnitude than the above-described switching current $I_{SW}$.

The read circuit RD_CIR is configured to provide the read current $I_R$ to the selected storage cell SC in a set or predetermined direction in response to the read operation signal RD. In FIG. 3, the predetermined direction corresponds to the second direction D. The read circuit RD_CIR compares a reference current $I_{REF}$ to the read current $I_R$, and detects the state of the variable resistance element variable resistance element R. Next, the read circuit RD_CIR outputs data corresponding to the detected state of the variable resistance element variable resistance element R as output data OUT_DATA. The reference current $I_{REF}$ may have a value between the read current $I_R$ when the variable resistance element variable resistance element R is in the first state and the read current $I_R$ when the variable resistance element variable resistance element R in in the second state. Thus, when the read current $I_R$ is greater than the reference current $I_{REF}$, it is determined that the variable resistance element variable resistance element R is in the first state, and when the read current $I_R$ is smaller than the reference current $I_{REF}$, it is determined that the variable resistance element variable resistance element R is in the second state.

Based on the above-described configuration, the operation of the memory circuit is further described as follows.

The temperature sensor 330 senses or detects the temperature of the cell array 350 and generates the temperature information TEMP<0:A>. The voltage adjuster 310 adjusts the back bias voltage VBB based on the temperature information TEMP<0:A>, and the word line control unit 340 adjusts the activation voltage VACT based on the temperature information TEMP<0:A>. When the active operation signal ACT and the row address R_ADD are applied, the word line control unit 340 applies the activation voltage VACT to a word line corresponding to the row address R_ADD.

When the write operation signal WT is applied, the write circuit WT_CIR provides the write current $I_W$ in a direction determined by the input data IN_DATA, thereby switching the state of the variable resistance element variable resistance element R. When the read operation signal RD is applied, the read circuit RD_CIR provides the read current $I_R$ to the selected storage cell SC. The read circuit RD_CIR detects or determines the state of the variable resistance elementvariable resistance element R by comparing the magnitudes of the read current $I_R$ and the reference current $I_{REF}$, and outputs the determination result as the output data OUT_DATA.

The memory circuit in accordance with the present implementation adjusts the voltage levels of the back bias voltage VBB and the activation voltage VACT based on the temperature during an access operation. During a write operation, the memory circuit adjusts the back bias voltage VBB and the activation voltage VACT by taking into account of the change in the switching current due to the change in the temperature. Thus, the write current $I_W$ flowing in the variable resistance element R is optimized, thereby maximizing a process margin at all times. During a read operation, the memory circuit adjusts the back bias voltage VBB and the activation voltage VACT by taking into account of the change in the resistance of the variable resistance element R due to the change in the temperature. Thus, the read current IR flowing in the variable resistance element R is optimized, thereby maximizing a process margin at all times.

Figure 4:
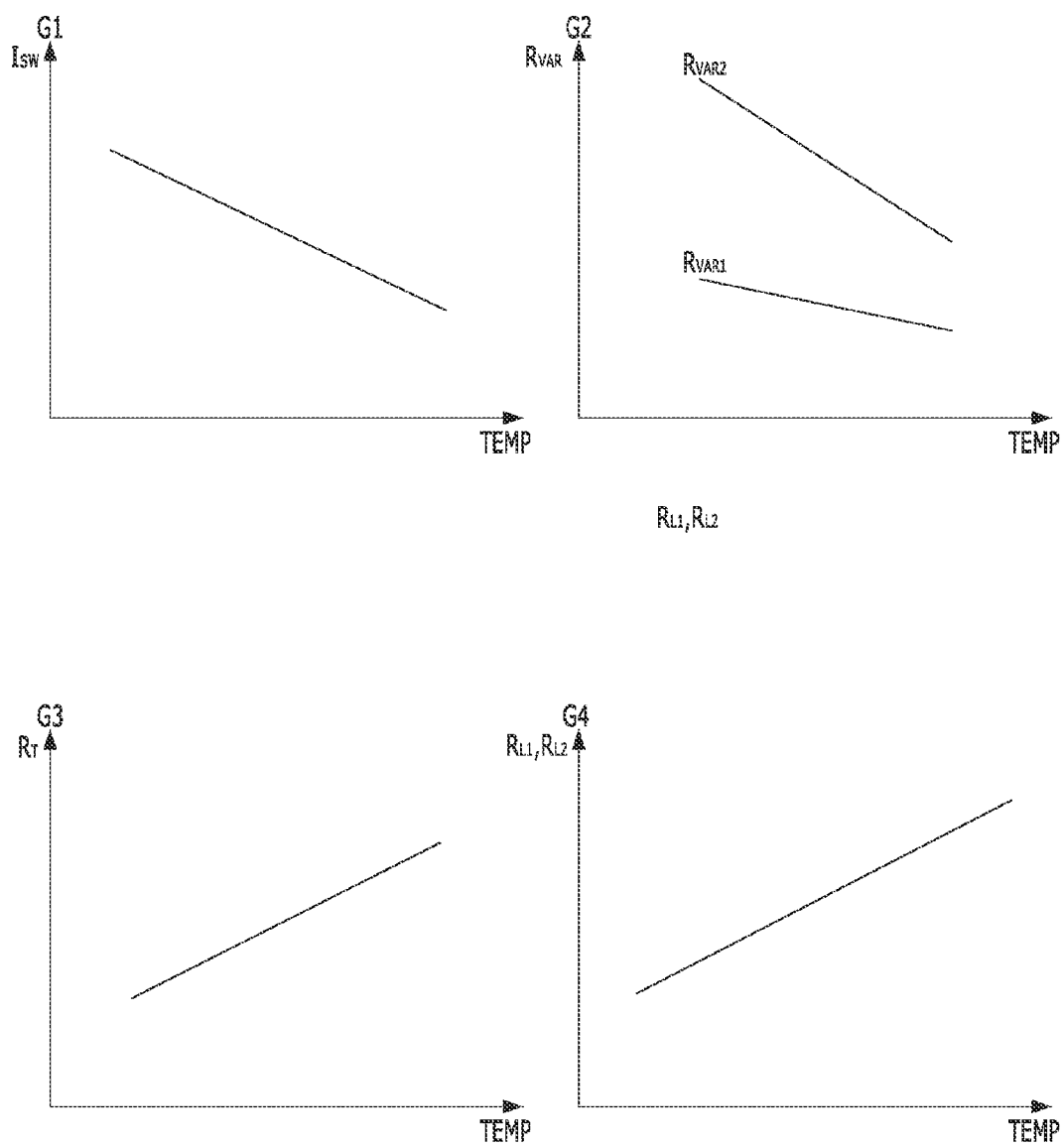
FIG. 4 is a diagram illustrating how the resistance values of components in the memory circuit of FIG. 3 changes with a temperature.

FIG. 4 is a diagram illustrating how the resistance values of the respective components in the memory circuit of FIG. 3 change with the temperature.

In FIG. 4, the first graph G1 shows how the switching current $I_{SW}$ changes with the temperature TEMP. As illustrated in the first graph G1, the switching current $I_{SW}$ decreases as the temperature TEMP increases. The switching current $I_{SW}$ indicates the minimum current to change the state of the variable resistance element R. For example, the switching current $I_{SW}$ may have the value between the minimum current required for changing the variable resistance element R from the first state to the second state and the minimum current required for changing the the variable resistance element R from the second state to the first state.

The graph G2 shows how resistance $R_{VAR}$ of the variable resistance element R changes with the temperature TEMP. As illustrated in the graph G2, the resistance value $R_{VAR}$ of the variable resistance element R decreases with the increase of temperature TEMP. In the graph G2, $R_{VAR1}$ and $R_{VAR2}$ indicate the change of resistance values of the variable resistance element R when the variable resistance element R has the first state and second state, respectively.

The third graph G3 shows how the resistance value $R_T$ of the selecting element T changes according to the temperature TEMP. As illustrated in the graph G3, the resistance value $R_T$ of the selecting element T increases with the increase of temperature TEMP.

The fourth graph G4 shows how resistance values $R_{L1}$ and $R_{L2}$ of the first line L1 and second line L2 change according to the temperature TEMP. As illustrated in the graph G4, the resistance values $R_{L1}$ and $R_{L2}$ of the first line L1 and the second line L2 increase with the increase of temperature TEMP.

Figure 5A:
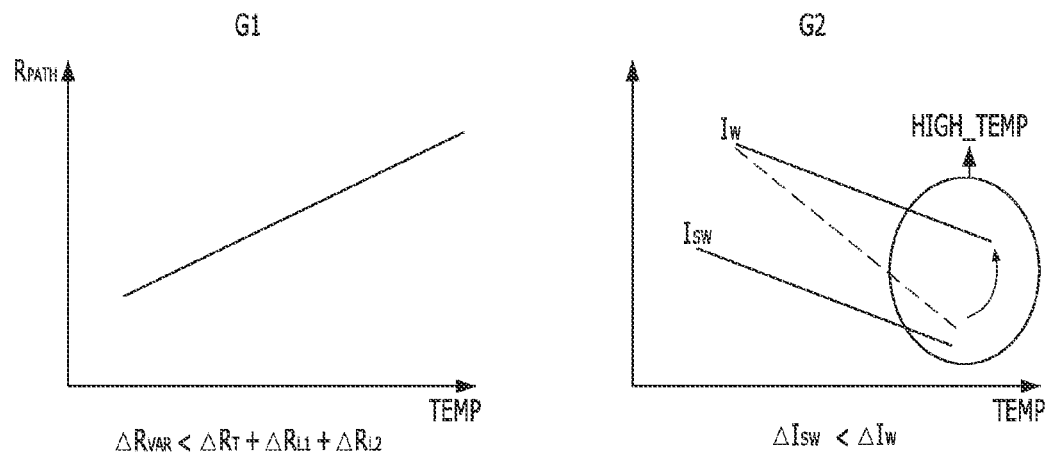
FIGS. 5A to 5C are diagrams for explaining how the memory circuit of FIG. 3 adjusts a back bias voltage BACK_BIAS and an activation voltage VACT during a writing operation and a read operation.
Figure 5A:
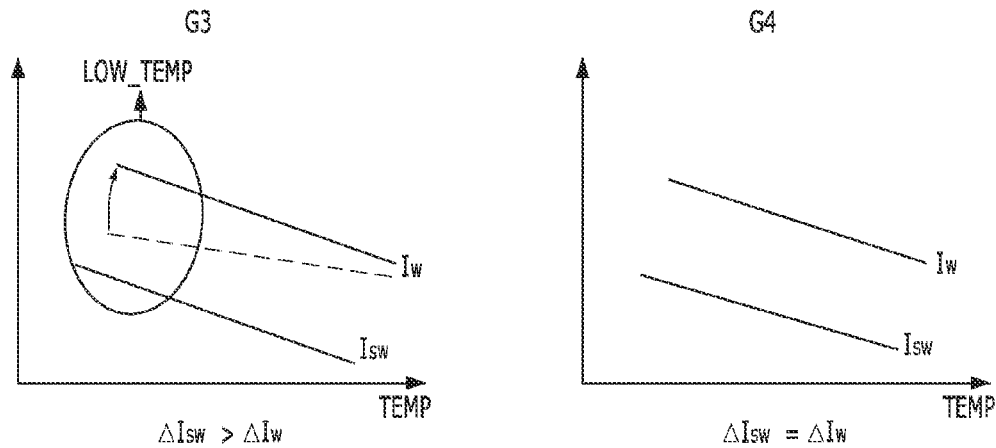
Figure 5A:
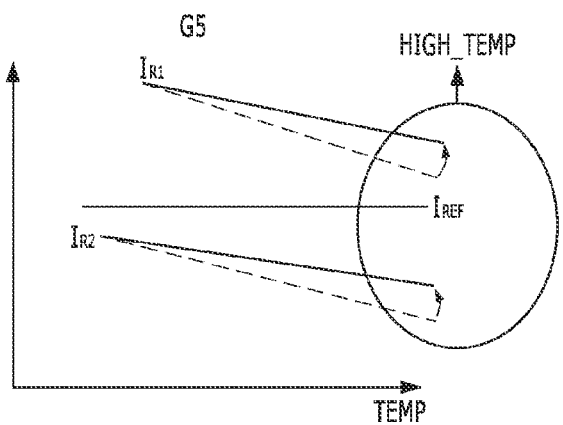
Figure 5B:
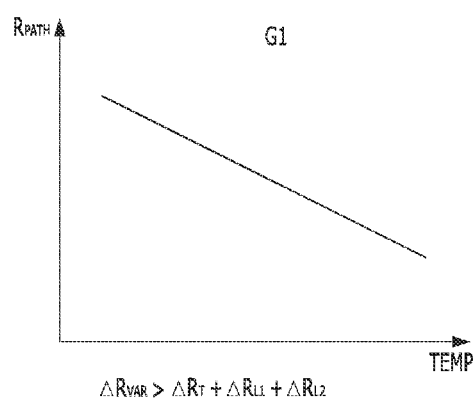
Figure 5B:
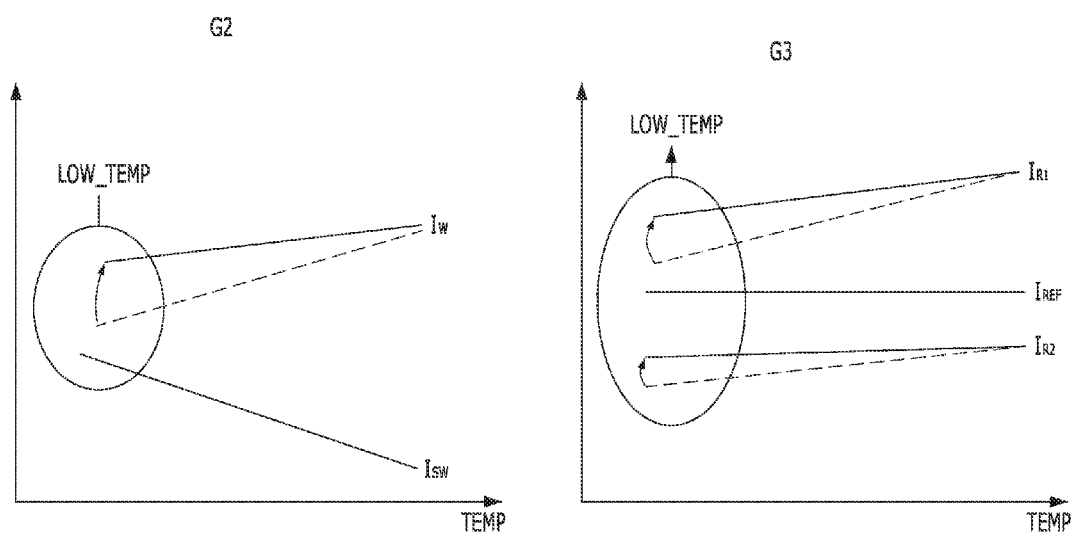
Figure 5C:
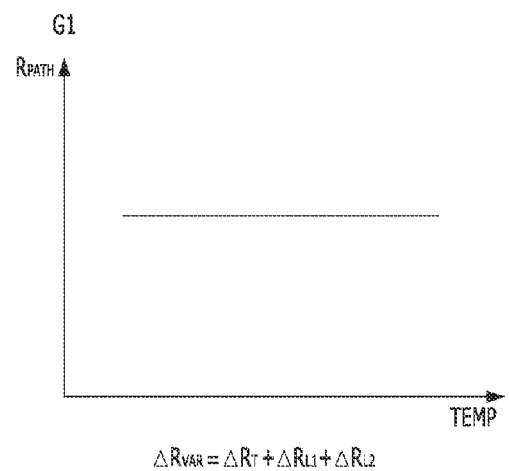
Figure 5C:
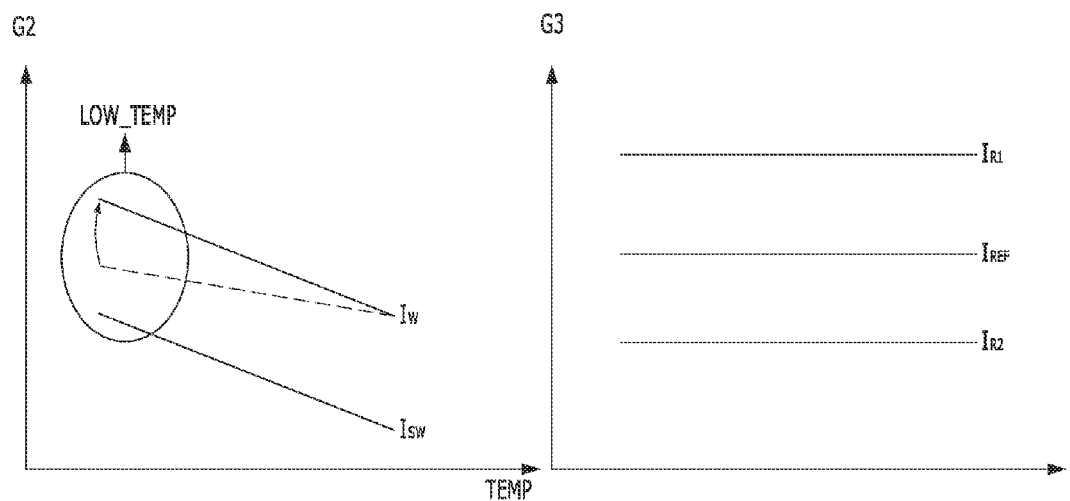

FIGS. 5A to 5C are diagrams for explaining how the memory circuit of FIG. 3 is operated to adjust the back bias voltage BACK_BIAS and the activation voltage VACT during a write operation and a read operation.

The amounts of access currents $I_W$ and $I_R$ can be changed by a change in the resistance value of a current path PATH through which the access currents $I_W$ and $I_R$ flow. Under the same conditions, the amounts of access currents $I_W$ and $I_R$ are inversely proportional to the resistance value $R_{PATH}$ of the current path PATH. As illustrated in FIG. 3, the current path PATH includes the variable resistance element R, the selecting element T, the first line L1, and the second line L2. Thus, the resistance value $R_{PATH}$ of the current path PATH amounts to the sum of the resistance value $R_{VAR}$ of the variable resistance element R, the resistance value $R_T$ of the selecting element T, the resistance value $R_{L1}$ of the first line L1, and the resistance value $R_{L2}$ of the second line L2. FIGS. 5A, 5B, and 5C represent three different relationships between the resistance value $R_{PATH}$ of the current path PATH and the temperature TEMP.

FIG. 5A is a diagram for explaining the operation of the memory circuit of FIG. 3 when the change of the resistance value $R_{PATH}$ of the current path PATH is proportional to the change of the temperature TEMP. Graph G1 shows that the change of $R_{VAR}$ of the variable resistance element R is smaller than the sum of the changes of $\Delta R_T$, $R_{L1}$, and $\Delta R_{L2}$. In particular, a decrease $\Delta R_{VAR}$ of the variable resistance element R according to the increase of temperature is smaller than the sum of an increase $\Delta R_T$ of the selecting element T according to the increase of temperature TEMP, an increase $\Delta R_{L1}$ of the first line L1 according to the increase of temperature TEMP, and an increase $\Delta R_{L2}$ of the second line L2 according to the increase of temperature TEMP. In this case, as illustrated in the first graph G1, the resistance value $R_{PATH}$ of the current path PATH increases with the increase of temperature TEMP. Thus, the write current $I_W$ decreases with the increase of the temperature TEMP.

In operation, the adjustment of the back bias voltage VBB and the activation voltage VACT may use different methods depending on relationships between the decrease $\Delta I_{SW}$ of the switching current $I_{SW}$ according to the increase of the temperature TEMP and the decreased amount $\Delta I_W$ in the write current $I_W$ according to the increase of the temperature TEMP. FIG. 5A shows four different relationships between the decreased amount $\Delta I_{SW}$ in the switching current $I_{SW}$ and the decreased amount $\Delta I_W$ in the write current $I_W$.

As shown in the second graph G2 in FIG. 5A, the first type of the relationship is (1) when the decrease $\Delta I_{SW}$ of the switching current $I_{SW}$ according to the increase of temperature TEMP is smaller than the decrease $\Delta I_W$ of the write current $I_W$ according to the increase of temperature TEMP. In the second graph G2, a dotted line indicates how the write current $I_W$ changes with the temperature in a conventional memory circuit, and a solid line indicates how the write current $I_W$ changes with the temperature in the memory circuit of FIG. 3. In order to improve a process margin during a writing operation, the switching current $I_{SW}$ and the write current $I_W$ needs to have a large difference therebetween in the full range of the temperature.

In some implementations of conventional memory circuits, since the difference between the switching current $I_{SW}$ and the write current $I_W$ is small in a high temperature region HIGH_TEMP, a sufficient margin cannot be secured in the high temperature region. Different from such conventional memory circuits, the memory circuit of FIG. 3 provides the voltage adjuster 310 and the word line control unit 340 to obtain a sufficient margin to improve the performance of the memory circuit. In operation, the voltage adjuster 310 in the memory circuit of FIG. 3 increases the back bias voltage VBB with the increase of temperature based on the temperature information TEMP<0:A>, and the word line control unit 340 increases the activation voltage VACT with the increase of temperature based on the temperature information TEMP<0:A>. As described above, the write current $I_W$ increases with the increase of the back bias voltage VBB and the activation voltage VACT. Thus, in the memory circuit of FIG. 3, the write current $I_W$ changes with the temperature as indicated by the solid line, and a sufficient margin can be secured even in the high temperature region HIGH_TEMP.

As shown in the third graph G3 in FIG. 5A, the second type of the relationship is (2) when the decrease $\Delta I_{SW}$ of the switching current $I_{SW}$ according to the increase of temperature TEMP is greater than the decrease $\Delta I_{SW}$ of the write current $I_{SW}$ according to the increase of temperature TEMP. In the third graph G3, a dotted line indicates how the write current $I_W$ changes with the temperature in the conventional memory circuit, and a solid line indicates how the write current $I_W$ changes with the temperature in the memory circuit of FIG. 3.

In some implementations of conventional memory circuits, since a difference between the switching current $I_{SW}$ and the write current $I_W$ is small in a low temperature region LOW_TEMP, a sufficient margin cannot be secured in the low temperature region. However, the memory circuit of FIG. 3 operates to increase the back bias voltage VBB and the activation voltage VACT with the decrease of temperature. Since the write current $I_W$ increases with the increase of the back bias voltage VBB and the activation voltage VACT, the write current $I_W$ changes with the temperature in the memory circuit of FIG. 3 as indicated by the solid line. Thus, a sufficient margin can be secured even in the low temperature region LOW_TEMP.

As shown in the fourth graph G4 in FIG. 5A, the third type of the relationship is (3) when the decrease $\Delta I_{SW}$ of the switching current $I_{SW}$ according to the increase of temperature is equal to the decrease $\Delta I_{SW}$ of the write current $I_{SW}$ according to the increase of temperature.

As illustrated in the fourth graph G4, a difference between the switching current $I_{SW}$ and the write current $I_W$ is maintained at a set value, when the back bias voltage VBB and the activation voltage VACT are maintained at a set level. Thus, the memory circuit of FIG. 3 maintains the back bias voltage VBB and the activation voltage VACT at set values.

The fifth graph G5 in FIG. 5A shows (4) the fourth type of the relationship between the read current $I_R$ and the reference current $I_{REF}$ according to the temperature. In the fifth graph G5, $I_{R1}$ represents a read current when the variable resistance element R has the first state, and $I_{R2}$ represents a read current when the variable resistance element R has the second state. According to the relationship that the resistance $R_{PATH}$ of the current path PATH increases in proportional to the change of the temperature TEMP, both of the read currents $I_{R1}$ and $I_{R2}$ decrease with the increase of temperature TEMP. At this time, the amount of the decrease in read current $I_{R1}$ is greater than the amount of the decrease in the read current $I_{R2}$. In the fifth graph G5, a dotted line indicates how the read currents $I_{R1}$ and $I_{R2}$ change with the temperature in the conventional memory circuit, and a solid line indicates how the read currents $I_{R1}$ and $I_{R2}$ change with the temperature in the memory circuit of FIG. 3.

In some implementations of conventional memory circuits, since a difference between the read current $I_{R1}$ and the reference current $I_{REF}$ is small in the high temperature region HIGH_TEMP, a sufficient margin cannot be secured in the high temperature region. However, the memory circuit of FIG. 3 operates to increase the back bias voltage VBB and the activation voltage VACT with the increase of temperature. Since the read currents $I_{R1}$ and $I_{R2}$ increase with the increase of the back bias voltage VBB and the activation voltage VACT, the read currents $I_{R1}$ and $I_{R2}$ change with the temperature TEMP in the memory circuit of FIG. 3 as indicated by the solid line. Thus, a sufficient margin can be secured even in the high temperature region HIGH_TEMP.

FIG. 5B is a diagram for explaining the operation of the memory circuit of FIG. 3 when the change of the resistance value $R_{PATH}$ of the current path PATH is inversely proportional to the change of the temperature TEMP. Graph G1 shows that the change of $R_{VAR}$ of the variable resistance element R is greater than the sum of the changes of $\Delta R_T$, $R_{L1}$, and $\Delta R_{L2}$. In particular, the decrease $\Delta R_{VAR}$ in resistance $R_{VAR}$ of the variable resistance element R according to the increase of temperature TEMP is greater than the sum of the increase $\Delta R_T$ in resistance $R_T$ of the selecting element T according to the increase of temperature TEMP, the increase $\Delta R_{L1}$ in resistance $R_{L1}$ of the first line L1 according to the increase of temperature TEMP, and the increase $\Delta R_{L2}$ in resistance $R_{L2}$ of the second line L2 according to the increase of temperature TEMP. In this case, as illustrated in the first graph G1, the resistance $R_{PATH}$ of the current path PATH decreases with the increase of temperature TEMP.

The second graph G2 in FIG. 5B shows that when the resistance $R_{PATH}$ of the current path PATH decreases with the increase of temperature, the relationship between the switching current $I_{SW}$ and the write current $I_W$ with the increase of temperature TEMP during a writing operation. As illustrated in the second graph G2, the write current $I_W$ increases with the increase of temperature TEMP. In the second graph G2, a dotted line indicates how the write current $I_W$ changes with the temperature in the conventional memory circuit, and a solid line indicates how the write current $I_W$ changes according to the temperature in the memory circuit of FIG. 3.

In some implementations of conventional memory circuits, since a difference between the switching current $I_{SW}$ and the write current $I_W$ is small in a low temperature region LOW_TEMP, a sufficient margin cannot be secured in the low temperature region LOW_TEMP. However, the memory circuit of FIG. 3 operates to increase the back bias voltage VBB and the activation voltage VACT with the decrease of temperature. Since the write current $I_W$ increases with the increase of the back bias voltage VBB and the activation voltage VACT, the write current $I_W$ changes with the temperature in the memory circuit of FIG. 3 as indicated by the solid line. Thus, a sufficient margin can be secured even in the low temperature region LOW_TEMP.

The third graph G3 of FIG. 5B indicates the relationship between the read current $I_R$ and the reference current $I_{REF}$ according to the temperature. In the third graph G3, $I_{R1}$ represents a read current when the variable resistance element R has the first state, and $I_{R2}$ represents a read current when the variable resistance element R has the second state. According to the relationship between the temperature TEMP and the resistance $R_{PATH}$ of the current path PATH, both of the read currents $I_{R1}$ and $I_{R2}$ increase with the increase of temperature TEMP. At this time, the amount of the increase in the read current $I_{R1}$ is greater than the amount of the increase in the read current $I_{R2}$. In the third graph G3, a dotted line indicates how read currents $I_{R1}$ and $I_{R2}$ change according to the temperature in the conventional memory circuit, and a solid line indicates how the read currents $I_{R1}$ and $I_{R2}$ change according to the temperature in the memory circuit of FIG. 3.

In some implementations of conventional memory circuits, since a difference between the read current $I_{R1}$ and the reference current $I_{REF}$ is small in the low temperature region LOW_TEMP, a sufficient margin cannot be secured in the low temperature region LOW_TEMP. However, the memory circuit of FIG. 3 increases the back bias voltage VBB and the activation voltage VACT with the decrease of temperature. Since the read current $I_R$ increases with the increase of the back bias voltage VBB and the activation voltage VACT, the read currents $I_{R1}$ and $I_{R2}$ change according to the temperature TEMP in the memory circuit of FIG. 3 as indicated by the solid line. Thus, a sufficient margin can be secured even in the low temperature section LOW_TEMP.

FIG. 5C is a diagram for explaining the operation of the memory circuit of FIG. 3 when the change of the resistance value $R_{PATH}$ of the current path PATH is constant with respect to the change in the temperature TEMP. Graph G1 shows that the change of $R_{VAR}$ of the variable resistance element R is equal to the sum of the changes of $\Delta R_T$, $R_{L1}$, and $\Delta R_{L2}$. In particular, the decrease $\Delta R_{VAR}$ of the resistance value of the variable resistance element R according to the increase in the temperature TEMP is equal to the sum of the increase $\Delta R_T$ of resistance $R_T$ of the selecting element T according to the increase in the temperature TEMP, the increase $\Delta R_{L1}$ of resistance $R_{L1}$ of the first line L1 according to the increase in the temperature TEMP, and the increase $\Delta R_{L2}$ of resistance $R_{L2}$ of the second line L2 according to the increase in the temperature TEMP.

Since the resistance value $R_{PATH}$ of the current path PATH is constant, the write current $I_W$ is also constant. In this case, the relationship between the switching current $I_{SW}$ and the write current $I_W$ is set as illustrated in the second graph G2. In the second graph G2, a dotted line indicates how the write current $I_W$ changes according to the temperature in the conventional memory circuit, and a solid line indicates how the write current $I_W$ changes according to the temperature in the memory circuit of FIG. 3.

In the conventional memory circuit, since a difference between the switching current $I_{SW}$ and the write current $I_W$ is small in a low temperature region LOW_TEMP, a sufficient margin cannot be secured in the low temperature region LOW_TEMP. However, the memory circuit of FIG. 3 operates to increase the back bias voltage VBB and the activation voltage VACT with the decrease of temperature. Since the write current $I_W$ increases with the increase of the back bias voltage VBB and the activation voltage VACT, the write current $I_W$ changes according to the temperature TEMP in the memory circuit of FIG. 3 as indicated by the solid line. Thus, a sufficient margin can be secured even in the low temperature section LOW_TEMP.

The third graph G3 indicates the relationship between the read current $I_R$ and the reference current $I_{REF}$ according to the temperature. In the third graph G3, $I_{R1}$ represents a read current when the variable resistance element R has the first state, and $I_{R2}$ represents a read current when the variable resistance element R has the second state. According to the relationship between the temperature TEMP and the resistance $R_{PATH}$ of the current path PATH, the read currents $I_{R1}$ and $I_{R2}$ are constant.

As illustrated in the graph G3, a difference between the read currents $I_{R1}$ and $I_{R2}$ and the reference current $I_{REF}$ is maintained at a set value, when the back bias voltage VBB and the activation voltage VACT are maintained at set levels. In this case, the memory circuit of FIG. 3 maintains the back bias voltage VBB and the activation voltage VACT at the set values.

Through the above-described method, the memory circuit may provide the optimized access currents $I_W$ and $I_R$ to the variable resistance element R in the full range of the temperature. As temperature changes, various electrical characteristics change as well, which include the resistance value $R_{PATH}$, the switching current $I_{SW}$, the write current $I_W$, and the relationship between the change of the switching current $I_{SW}$ and the change of the write current $I_W$. Such changes of the electrical characteristics depend on the design of the memory circuit, and may be measured through a test. The memory circuit as disclosed in this patent document can optimize a process margin based on measurement tests. By increasing a process margin during a writing operation and a read operation, it is also possible to reduce a likelihood of an error that occurs during the writing operation and the read operation of the memory circuit.

FIG. 6 is an example of a configuration diagram of a memory circuit or device including a variable resistance element. FIG. 6 illustrates a simplified configuration in order to easily explain the principle of optimizing a current flow in the variable resistance element according to the temperature. The memory circuit or device of FIG. 6 includes a plurality of cell arrays.

Referring to FIG. 6, the memory circuit includes a first global line GL1, a second global line GL2, a plurality of cell arrays CA1 to CAN, a plurality of word lines WL1<1:M> to WLN<1:M>, a plurality of first transistors TR1<1:N>, a plurality of second transistors TR2<1:N>, a voltage adjuster 610, and an access control unit 620. Each of the cell arrays CA1 to CAN includes a plurality of storage cells SC, a first line L1 coupled to one ends of the plurality of storage cells SC, and a second line coupled to the other ends of the plurality of storage cells SC. Each of the word lines WL1<1:M> to WLN<1:M> is coupled to a selecting element T of a corresponding storage cell among the plurality of storage cells SC of the plurality of cell arrays CA1 to CAN. The one ends of the first transistors TR1<1:N> are connected to the first global line GL1 and the other ends of the first transistors TR1<1:N> are connected to the plurality of cell arrays CA1 to CAN, respectively. The one ends of the second transistors TR2<1:N> are connected to the second global line GL2 and the other ends of the second transistors TR2<1:N> are connected to the plurality of cell arrays CA1 to CAN, respectively. The voltage adjuster 610 is configured to adjust the voltage levels of back bias voltages VBB1 applied to the selecting element T and VBB2 applied to the plurality of first transistors TR1<1:N> and the plurality of second transistors TR2<1:N> according to the temperature change during an access operation. The access control unit 620 is configured to provide an access current $I_W$ or $I_R$ during an access operation to a selected storage cell among the plurality of storage cells SC of the plurality of cell arrays CA1 to CAN.

The memory circuit further includes a temperature sensor 630, a word line control unit 640, and a select signal generator 650. The temperature sensor 630 is configured to sense the temperature and generate temperature information TEMP<0:A>. The word line control unit 340 is configured to activate a selected word line among the plurality of word lines WL1 to WLN in a selected cell array in response to a row address R_ADD when an active operation signal ACT is applied, and control the voltage level of an activation voltage VACT applied to the selected word line based on the temperature information TEMP<0:A>. The select signal generator 650 is configured to generate a plurality of select signals SEL1 to SELN corresponding to the respective cell arrays CA1 to CAN, activate one or more of the plurality of select signals SEL1 to SELN, and adjust the voltage level of the activated select signal according to the temperature change.

Referring to FIG. 6, the memory circuit will be described as follows.

The memory circuit of FIG. 6 differs from the memory circuit of FIG. 3 in that the memory circuit of FIG. 6 includes the plurality of cell arrays CA1 to CAN of which the both terminals are connected to the global lines GL1 and GL2, respectively.

The design of the memory circuit of FIG. 6 renders the electrical characteristics of the elements of the memory circuit to change with the temperature. For example, the variable resistance element R, the selecting element T, the first transistor TR1<1:N>, the second transistor TR2<1:N>, the first line L1, the second line L2, the first global line GL1, and the second global line GL2 may change their electrical characteristics according to the temperature change. For example, as temperature changes, the variable resistance element R, the selecting element T, the first line L1, and the second line L2 have the same changes in electrical characteristics as those described with reference to FIG. 3. As the temperature increases, resistance values $R_{TR1}$, $R_{TR2}$, $R_{GL1}$, and $R_{GL2}$ of the first transistor TR1<1:N>, the second transistor TR2<1:N>, the first global line GL1, and the second global line GL2 increase.

The temperature sensor 630 operates in the same manner as the temperature sensor 330 of FIG. 3. A region of which the temperature is sensed by the temperature sensor 630 may include the plurality of cell arrays CA1 to CAN or portions adjacent to the plurality of cell arrays CA1 to CAN.

The voltage adjuster 610 is configured to adjust the back bias voltages VBB1 applied to selecting elements T and VBB2 applied to the first transistors TR1<1:N> and the second transistors TR2<1:N> based on the temperature information TEMP<0:A>. In FIG. 6, VBB1 represents the back bias voltage applied to the selecting element T, and VBB2 represents the back bias voltages applied to the first transistor TR1<1:N> and the second transistor TR2<1:N>. The back bias voltages VBB1 and VBB2 may be equal to each other or different from each other. When the back bias voltage VBB2 increases, the resistance values $R_{TR1}$ and $R_{TR2}$ of the first transistor TR1<1:N> and the second transistor TR2<1:N> decrease, and when the back bias voltage VBB1 decreases, the resistance values $R_{TR1}$ and $R_{TR2}$ of the first transistor TR1<1:N> and the second transistor TR2<1:N> increase. The operation of the voltage adjuster 610 will be described below in detail with reference to FIG. 8.

The word line control unit 640 is configured to activate a word line selected by using the row address R_ADD among the plurality of word lines WL1<1:M> to WLN<1:M>, when the active operation signal ACT is applied. At this time, all the word lines corresponding to the row address are not activated, but a word line corresponding to the row address R_ACC in the selected cell array among the plurality of cell arrays CA1 to CAN is activated. The operations of the word line control unit 640 will be described below in detail with reference to FIG. 8.

The select signal generator 650 is configured to provide a select signal for a cell array with a cell array address CA_ADD, when a write operation signal WT or read operation signal RD is applied. Among the plurality of first transistors TR1<1:N> and the plurality of second transistors TR2<1:N>, first and second transistors receiving the select signal are turned on. Thus, a current may flow to a storage cell SC coupled to the activated word line in the selected cell array. As the voltage level of the activated select signal increases, the first and second transistors T are strongly turned on to provide a large amount of current, and as the voltage level of the activated select signal decreases, the first and second transistors are weakly turned on to provide a small amount of current. The operation of the select signal generator 650 will be described below in detail with reference to FIG. 8.

The access control unit 620 operates in the same manner as the access control unit 320 of FIG. 3 except that the access control unit 620 is coupled to the first and second global lines GL1 and GL2. The access control unit 620 provides an access current to the selected storage cell SC of the selected cell array in response to an access command WT or RD during an access operation. The access control unit 620 may apply a set voltage between the first and second global lines GL1 and GL2 and provide an access current to the selected storage cell SC during the access operation. The access control unit 620 has the same configuration and operation as the access control unit 320 of FIG. 3.

The memory circuit of FIG. 6 operates in the same manner as the memory circuit of FIG. 3 in that the back bias voltage VBB1 (corresponding to the back bias voltage VBB of FIG. 3) and the activation voltage VACT are adjusted based on the temperature information TEMP<0:A>. In addition, the memory circuit of FIG. 6 operates to further adjust the voltage levels of the back bias voltage VBB2 and the select signal based on the temperature information TEMP<0:A>.

The memory circuit in accordance with the present implementation adjusts the voltage levels during a write operation by taking into account of the change of the switching current according to the change of the temperature. Thus, the write current $I_W$ flowing in the variable resistance element R is optimized, thereby maximizing a process margin. Furthermore, the memory circuit adjusts the voltage levels during a read operation in consideration of the change in resistance value of the variable resistance element R according to the change of temperature. Thus, the read current $I_R$ flowing in the variable resistance element R is to optimized, thereby maximizing a process margin.

Figure 7:
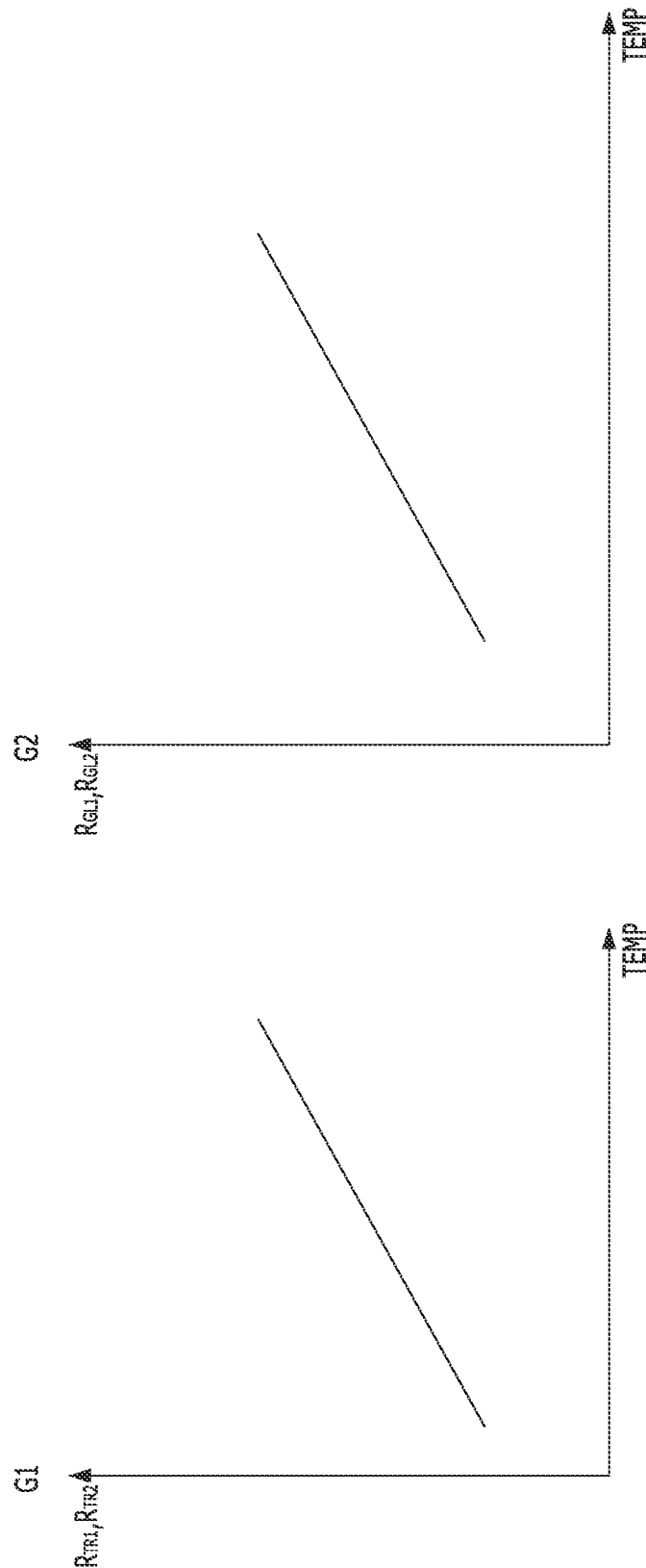
FIG. 7 is a diagram illustrating how the resistance values of components in the memory circuit of FIG. 6 change with a temperature.

FIG. 7 is a diagram illustrating how the resistance values of the respective components in the memory circuit of FIG. 6 change according to the temperature.

The switching current $I_{SW}$, the resistance value $R_{VAR}$ of the variable resistance element R, the resistance value $R_T$ of the selecting element T, and the resistance values $R_{L1}$ and $R_{L2}$ of the first line L1 and the second line L1 and L2 change in the same manner as described with reference to FIG. 4.

In FIG. 7, the first graph G1 shows how the resistance values $R_{L1}$ and $R_{L2}$ of the first transistors TR1<1:N> and the second transistors TR2<1:N> change with the temperature TEMP. As illustrated in the first graph G1, the resistance values $R_{L1}$ and $R_{L2}$ of the first transistors TR1<1:N> and the second transistors TR2<1:N> increase with the increase of temperature TEMP.

A second graph G2 shows how the resistance values $R_{GL1}$ and $R_{GL2}$ of the first global line GL1 and the second global line GL2 change with the temperature TEMP. As illustrated in the second graph G2, the resistances values $R_{GL1}$ and $R_{GL2}$ of the first global line GL1 and the second global line GL2 increase with the increase of temperature TEMP.

Figure 8A:
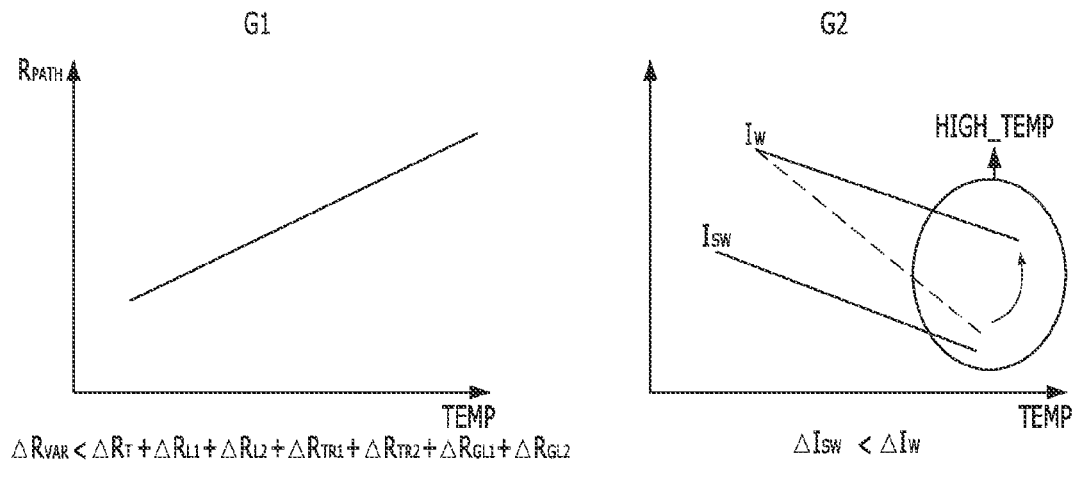
FIGS. 8A to 8C are diagrams for explaining how the memory circuit of FIG. 6 adjusts the voltage levels of a back bias voltage BACK_BIAS and an activation voltage VACT during a writing operation and a read operation.
Figure 8A:
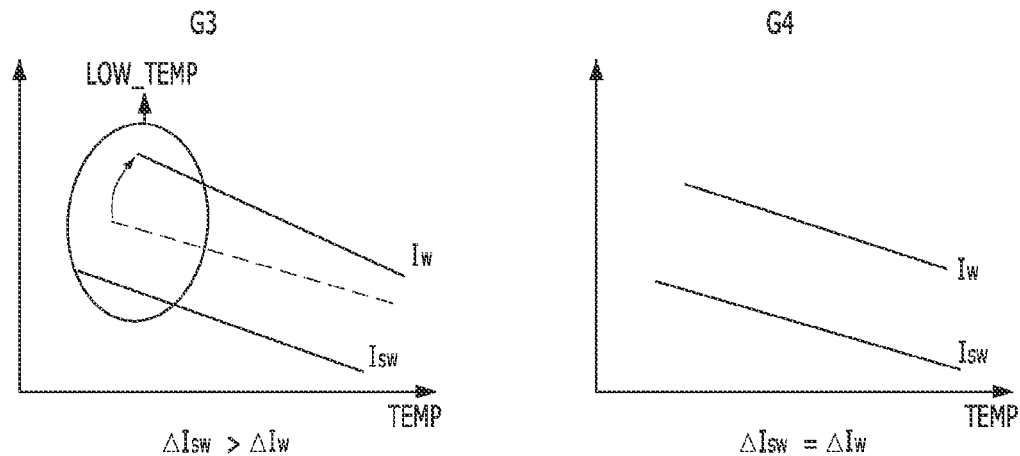
Figure 8A:
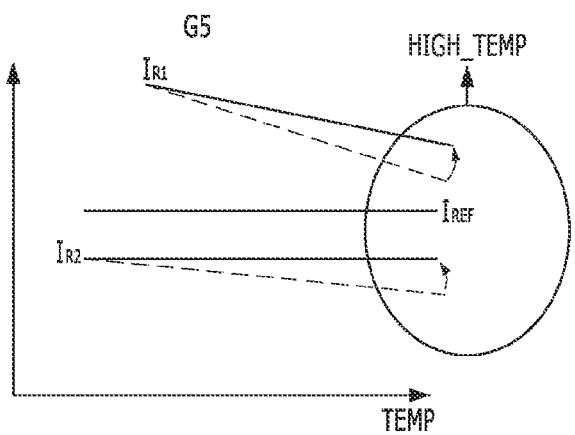
Figure 8B:
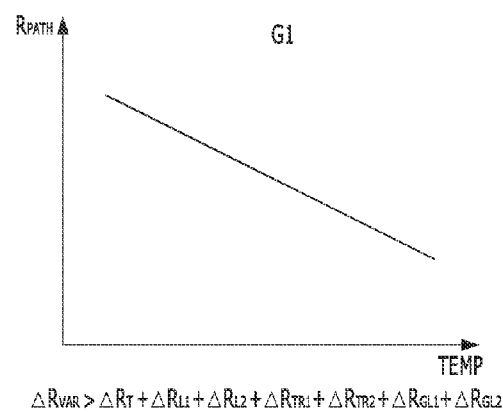
Figure 8B:
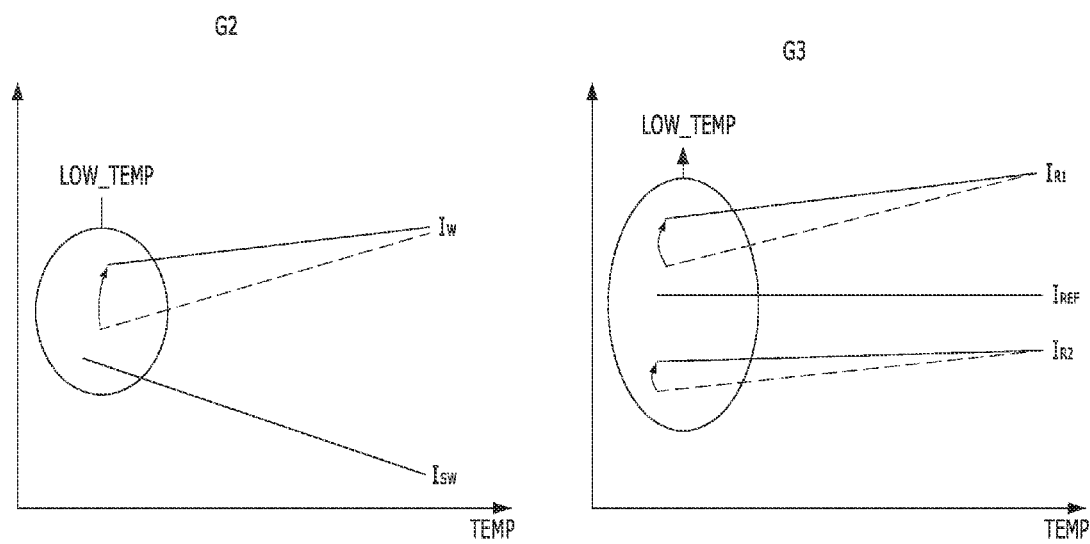
Figure 8C:
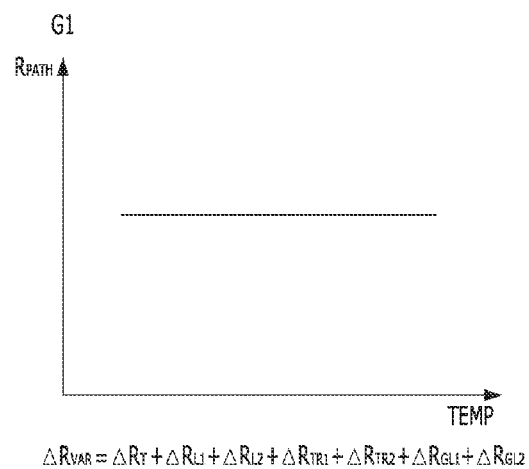
Figure 8C:
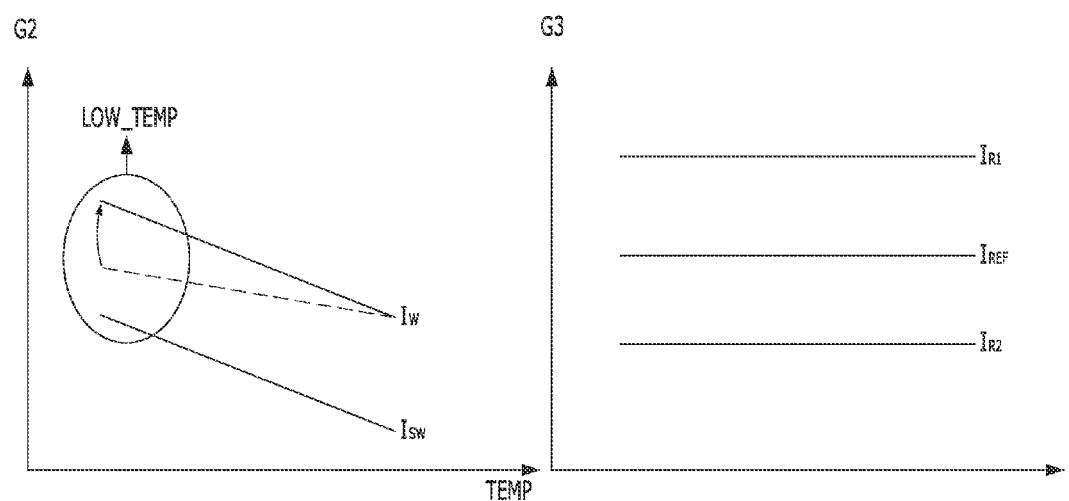

FIGS. 8A to 8C are diagrams for explaining how the memory circuit of FIG. 6 adjusts the voltage levels including the back bias voltages BACK_BIAS1 and BACK_BIAS2, the activation voltage VACT, and the activated select signal during a writing operation and a read operation.

The memory circuit of FIG. 6 includes the variable resistance element R, the selecting element T, the first line L1, and the second line L2, which are also included in the memory circuit of FIG. 3. In addition, the memory circuit of FIG. 6 includes the first transistors TR1<1:N>, the second transistors TR2<1:N>, the first global line GL1, and the second global line GL2 in the current path PATH. Thus, the resistance value $R_{PATH}$ of the current path PATH amounts to the sum of the resistance value $R_{VAR}$ of the variable resistance element R, the resistance value $R_T$ of the selecting element T, the resistance value $R_{L1}$ of the first line L1, the resistance value $R_{L2}$ of the second line L2, the resistance value $R_{TR1}$ of the first transistor TR1<1:N>, the resistance value $R_{TR2}$ of the second transistor TR2<1:N>, the resistance value $R_{GL1}$ of the first global line GL1, and the resistance value $R_{GL2}$ of the second global line GL2. FIGS. 8A, 8B, and 8C represent three different relationships between the resistance value $R_{PATH}$ of the current path PATH and the change of the temperature TEMP.

FIG. 8A which corresponds to FIG. 5A shows a diagram for explaining the operation of the memory circuit of FIG. 6 when the change of the resistance value $R_{PATH}$ of the current path PATH is proportional to the change of the temperature TEMP. Graph G1 shows that the resistance value $R_{PATH}$ of the current path PATH increases with the increase of the temperature TEMP. In particular, a decrease $\Delta R_{VAR}$ of the variable resistance element R according to the increase of temperature is smaller than the sum of an increase $\Delta R_T$ of the selecting element T according to the increase of temperature TEMP, an increase $\Delta R_{TR1}$ of the first transistor according to the increase of temperature TEMP, an increase $\Delta R_{TR2}$ of the second transistor according to the increase of temperature TEMP, an increase $\Delta R_{L1}$ of the first line L1 according to the increase of temperature TEMP, an increase $\Delta R_{L2}$ of the second line L2 according to the increase of temperature TEMP, an increase $\Delta R_{GL1}$ of the first global line GL1 according to the increase of temperature TEMP, and an increase $\Delta R_{GL2}$ of the second global line GL2 according to the increase of temperature TEMP. The adjustment to the voltage levels may vary depending on relationships between the decreased amount $\Delta I_{SW}$ in the switching current $I_{SW}$ and the decreased amount $\Delta I_W$ in the write current $I_W$, both of which are caused by the temperature change. FIG. 8A shows four different types of the relationship between the decrease $\Delta I_{SW}$ of the switching current $I_{SW}$ and the decrease $\Delta I_W$ of the write current $I_W$.

As shown in the second graph G2 in FIG. 8A, the first type of the relationship is (1) when a decrease $\Delta I_{SW}$ of the switching current $I_{SW}$ according to the increase of temperature is smaller than a decrease $\Delta I_W$ of the write current $I_W$ according to the increase of temperature. As described with reference to G2 of FIG. 5A, the write current $I_W$ needs to increase with the increase of temperature. In order to increase the write current $I_W$, the voltage adjuster 610, the word line control unit 640 and the select signal generator 650 operate in the following manners. The voltage adjuster 610 in the memory circuit of FIG. 6 increases the back bias voltages BACK_BIAS1 and BACK_BIAS2 with the increase of temperature. The word line control unit 640 increases the activation voltage VACT with the increase of temperature. The select signal generator 650 increases the voltage level of the activated select signal.

As shown in the third graph G3, the second type of the relationship is (2) when the decrease $\Delta I_{SW}$ of the switching current $I_{SW}$ according to the increase of temperature is greater than the decrease $\Delta I_W$ of the write current $I_W$ according to the increase of temperature. As described with reference to G3 of FIG. 5A, the write current $I_W$ needs to increase with the decrease of temperature. For this operation, the memory circuit of FIG. 6 operates to increase the voltage levels of the back bias voltages BACK_BIAS1 and BACK_BIAS2, the activation voltage VACT, and the activated select signal, with the decrease of temperature.

As shown in the fourth graph G4 in FIG. 8A, the fourth graph of the relationship is (3) when the decrease $\Delta I_{SW}$ of the switching current $I_{SW}$ according to the increase of temperature is equal to the decrease $\Delta I_W$ of the write current $I_W$ according to the increase of temperature. Thus, the memory circuit of FIG. 6 operates to maintain the voltage levels of the back bias voltages BACK_BIAS1 and BACK_BIAS2, the activation voltage VACT, and the activated select signal at set values.

The fifth graph G5 in FIG. 8A shows (4) the fourth type of the relationship which is the same as described with reference to G5 of FIG. 5A. Thus, the memory circuit of FIG. 6 operates to increase the voltage levels of the back bias voltages BACK_BIAS1 and BACK_BIAS2, the activation voltage VACT, and the activated select signal, with the increase of temperature.

FIG. 8B which corresponds to FIG. 5B shows a diagram for explaining the operation of the memory circuit of FIG. 6 when the change of the resistance value $R_{PATH}$ of the current path PATH is inversely proportional to the change of the temperature. Graph G1 shows that the decrease $\Delta R_{VAR}$ of the variable resistance element R according to the increase of temperature is greater than the sum of the increase $\Delta R_T$ of the selecting element T according to the increase of temperature TEMP, the increase $\Delta R_{TR1}$ of the first transistor according to the increase of temperature TEMP, the increase $\Delta R_{TR2}$ of the second transistor according to the increase of temperature TEMP, the increase $\Delta R_{L1}$ the first line L1 according to the increase of temperature TEMP, the increase $\Delta R_{L2}$ of the second line L2 according to the increase of temperature TEMP, the increase $\Delta R_{GL1}$ of the first global line GL1 according to the increase of temperature TEMP, and the increase $\Delta R_{GL2}$ of the second global line GL2 according to the increase of temperature TEMP.

The second graph G2 in FIG. 8B shows that when the resistance value $R_{PATH}$ of the current path PATH decreases with the increase of temperature TEMP, the write current $I_W$ increases with the increase of temperature TEMP. When the resistance $R_{PATH}$ of the current path PATH decreases with the increase of temperature TEMP, the relationship between the switching current $I_{SW}$ and the write current $I_W$ according to the increase of temperature during a writing operation is set as illustrated in the second graph G2. Thus, the write current $I_W$ needs to increase with the decrease of temperature. Thus, the memory circuit of FIG. 6 operates to increase the voltage levels of the back bias voltages BACK_BIAS1 and BACK_BIAS2, the activation voltage VACT, and the activated select signal, with the decrease of temperature.

The third graph G3 in FIG. 8B shows that the same relationship as described with reference to G3 of FIG. 5B. Thus, the memory circuit of FIG. 6 increases the voltage levels of the back bias voltages BACK_BIAS1 and BACK_BIAS2, the activation voltage VACT, and the activated select signal with the decrease of temperature.

FIG. 8C which corresponds to FIG. 5C shows a diagram for explaining the operation of the memory circuit of FIG. 6 when the change of the resistance value $R_{PATH}$ of the current path PATH is constant regardless of the change of the temperature. Graph G1 shows that the decrease $\Delta R_{VAR}$ of the variable resistance element R according to the increase of temperature is equal to the sum of the increase $\Delta R_T$ of the selecting element T according to the increase of temperature TEMP, the increase $\Delta R_{TR1}$ of the first transistor according to the increase of temperature TEMP, the increase $\Delta R_{TR2}$ of the second transistor according to the increase of temperature TEMP, the increase $\Delta R_{L1}$ of the first line L1 according to the increase of temperature TEMP, the increase $\Delta R_{L2}$ of the second line L2 according to the increase of temperature TEMP, the increase $\Delta R_{GL1}$ of the first global line GL1 according to the increase of temperature TEMP, and the increase $\Delta R_{GL2}$ of the second global line GL2 according to the increase of temperature TEMP.

Since the resistance value $R_{PATH}$ of the current path PATH is constant, the write current $I_W$ is also constant. Thus, the write current $I_W$ needs to increase with the decrease of temperature, as described with reference to G2 of FIG. 5C. For this operation, the memory circuit of FIG. 6 operates to increase the voltage levels of the back bias voltages BACK_BIAS1 and BACK_BIAS2, the activation voltage VACT, and the activated select signal, with the decrease of temperature.

The third graph G3 indicates the relationship which is the same as described with reference to G3 of FIG. 5C. Thus, the memory circuit of FIG. 6 maintains the voltage levels of the back bias voltages BACK_BIAS1 and BACK_BIAS2, the activation voltage VACT, and the activated select signal at set values.

Through the above-described method, the memory circuit may provide the optimized access current $I_W$ or $I_R$ to the variable resistance element R in the full range of the temperature. The change in the resistance value $R_{PATH}$ of the current path PATH according to the change of temperature, the change of the switching current $I_{SW}$ according to the change of temperature, the change of the write current $I_W$ according to the change of temperature, and the relationship between the change of the switching current $I_{SW}$ according to the change of temperature and the change of the write current $I_W$ according to the change of temperature may differ depending on the design of the memory circuit, and may be measured through a test. The memory circuit as designed in the above-described manners may optimize a process margin based on the measurement result. As a process margin increases during a writing operation and a read operation, errors of the writing operation and the read operation of the memory circuit can be reduced.

As described above, the back bias voltage VBB, the activation voltage VACT, and the select signals SEL1 to SELN are adjusted in different manners during a write operation and a read operation, respectively. The voltage adjuster 310 or 610, the word line control unit 330 or 630, and the select signal generator 650 receive both of the write operation signal WT and the read operation signal RD and properly adjust the back bias voltage VBB, the activation voltage VACT, and the select signals SEL1 to SELN based on the temperature information TEMP<0:A>.

In accordance with the above-described implementations, the electronic device may provide an optimized access current to a storage cell regardless of the change of temperature.

Thus, during a read or write operation, a sufficient margin can be secured in the full range of the temperature, thereby achieving accurate performance during the writing operation and the read operation.

The above and other memory circuits or semiconductor devices based on the disclosed technology can be used in a range of devices or systems. FIGS. 9-13 provide some examples of devices or systems that can implement the memory circuits disclosed herein.

Figure 9:
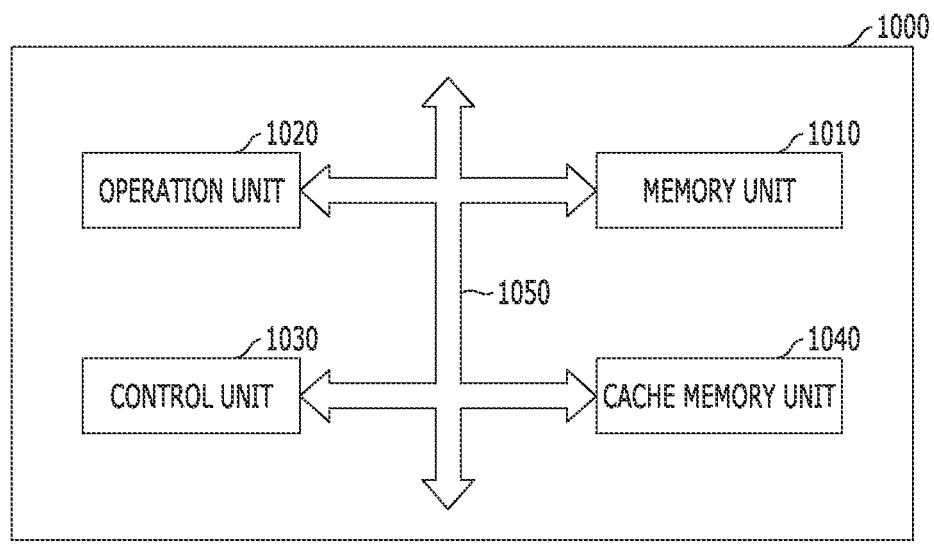
FIG. 9 shows an example of a configuration diagram of a microprocessor implementing memory circuitry based on the disclosed technology.

FIG. 9 shows an example of a configuration diagram of a microprocessor based on another implementation of the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current and read current of the memory unit 1010 can be optimized in accordance with the change of a temperature. Thus, the memory unit 1010 can achieve accurate performances and provide a sufficient process margin. Consequently, stability of the microprocessor 1000 can be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
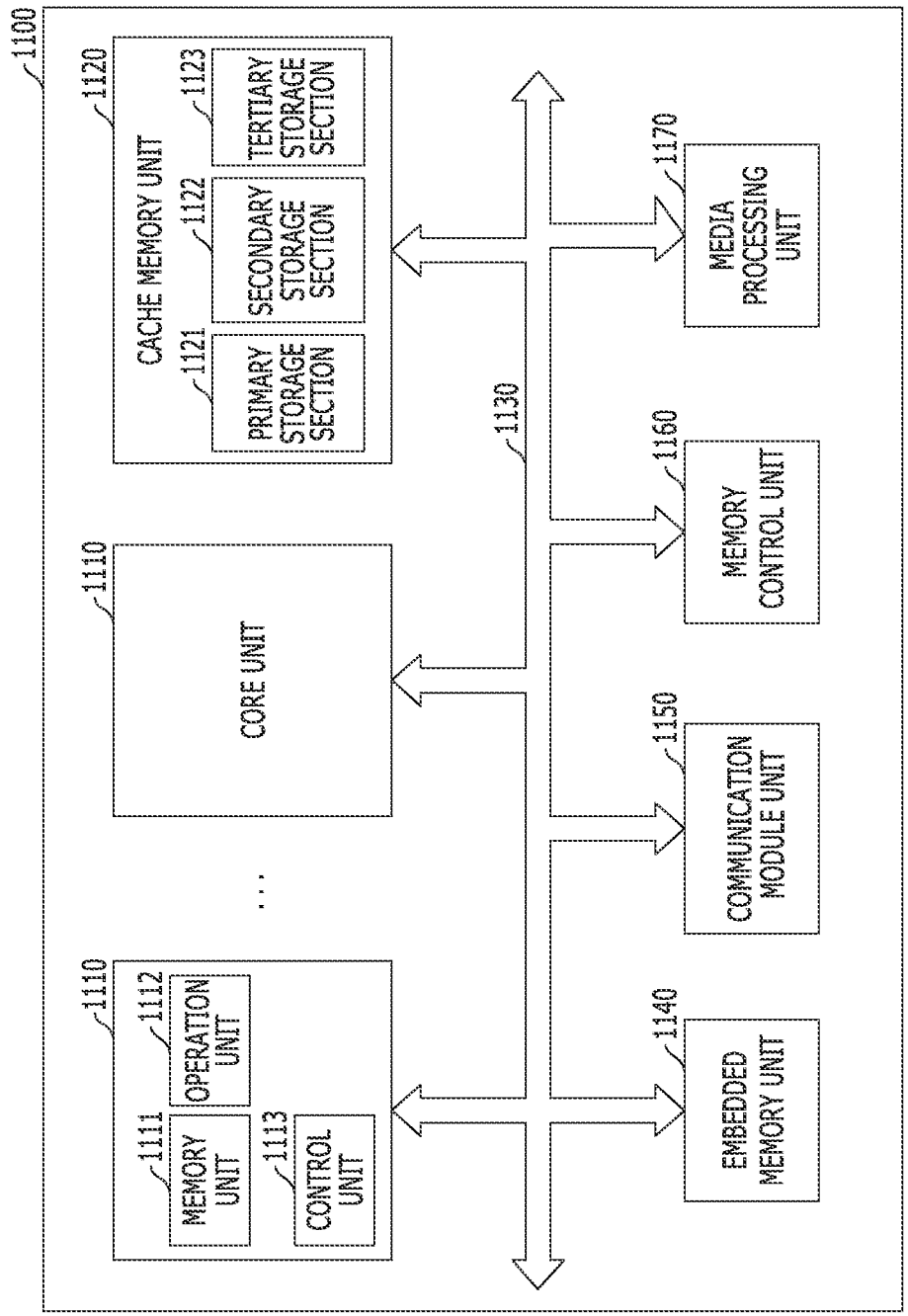
FIG. 10 shows an example of a configuration diagram of a processor implementing memory circuitry based on the disclosed technology.

FIG. 10 is a configuration diagram of a processor based on another implementation of the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current or read current of the cache memory unit 1120 can be optimized in accordance with the change of a temperature. Thus, the cache memory unit 1120 can achieve accurate performances and provide a sufficient process margin. Consequently, stability of the processor 1100 can be improved.

Although it was shown in FIG. 10 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
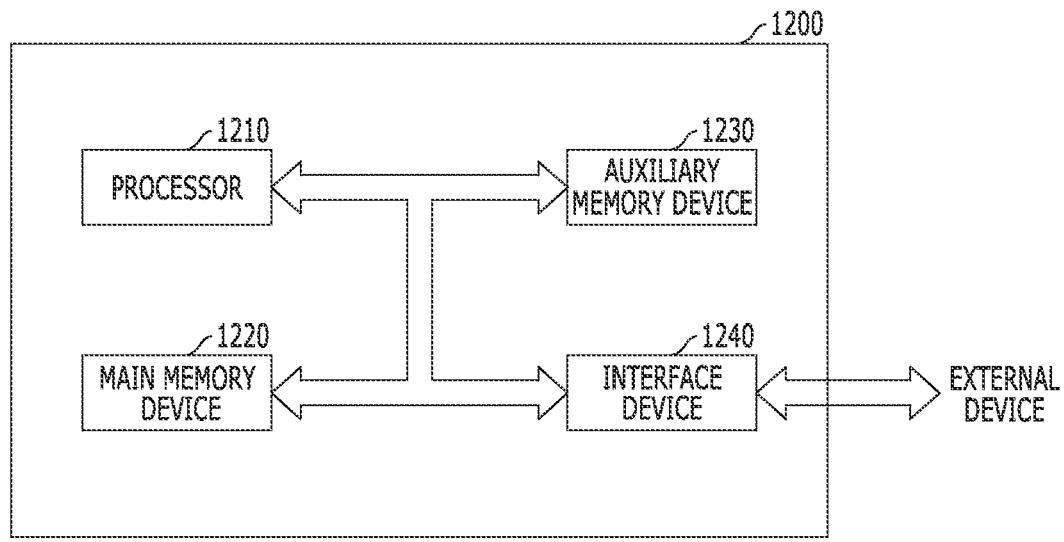
FIG. 11 shows an example of a configuration diagram of a system implementing memory circuitry based on the disclosed technology.

FIG. 11 is a configuration diagram of a system based on another implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current or read current of the main memory device 1220 can be optimized in accordance with the change of a temperature. Thus, the main memory device 1220 can achieve accurate performances and provide a sufficient process margin. Consequently, stability of the system 1200 can be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current or read current of the auxiliary memory device 1230 can be optimized in accordance with the change of a temperature Thus, the auxiliary memory device 1230 can achieve accurate performances and provide a sufficient process margin. Consequently, stability of the system 1200 can be improved.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
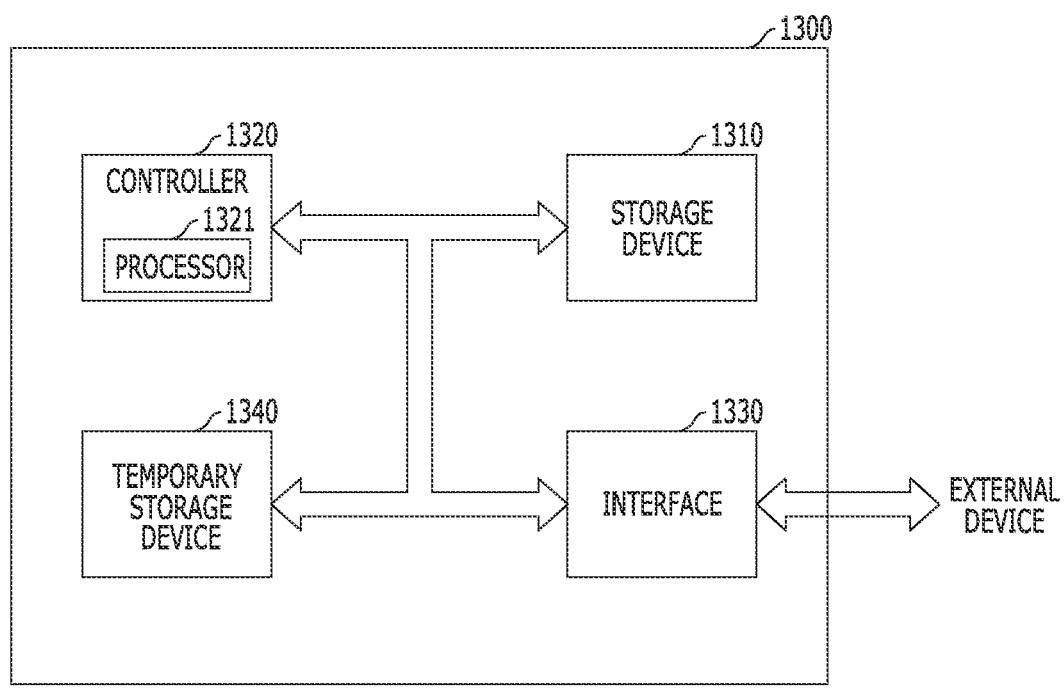
FIG. 12 shows an example of a configuration diagram of a data storage system implementing memory circuitry based on the disclosed technology.

FIG. 12 is a configuration diagram of a data storage system based on another implementation of the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current or read current of the temporary storage device 1340 may be optimized in accordance with the change of a temperature Thus, the temporary storage device 1340 can achieve accurate performances and provide a sufficient process margin. Consequently, stability of the data storage system 1300 can be improved.

Figure 13:
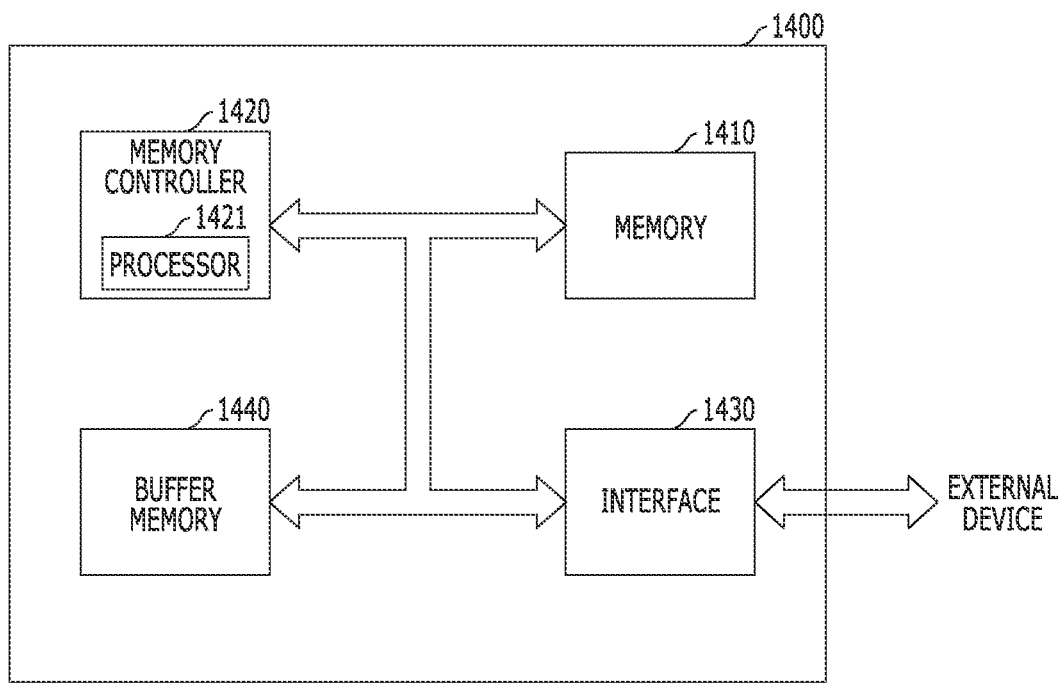
FIG. 13 shows an example of a configuration diagram of a memory system implementing memory circuitry based on the disclosed technology.

FIG. 13 is a configuration diagram of a memory system based on another implementation of the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current or read current of the memory 1410 may be optimized in accordance with the change of a temperature. Thus, the memory 1410 can achieve accurate performances and provide a sufficient process margin. Consequently, stability of the memory system 1400 can be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a plurality of storage cells each including a variable resistance element of which resistance is changed in response to a current flowing across the variable resistance element and a selecting element coupled to one end of the variable resistance element, a plurality of word lines corresponding to the respective storage cells and each coupled to a selecting element of a corresponding storage cell, a first line coupled to one ends of the plurality of storage cells, a second line coupled to the other ends of the plurality of storage cells, a voltage adjuster configured to adjust the voltage levels of back bias voltages of the selecting elements of the plurality of storage cells, and an access control unit electrically coupled to the first and second lines and passing an access current to a selected storage cell among the plurality of storage cells. Through this, a write current or read current of the buffer memory 1440 can be optimized in accordance with the change of a temperature. Thus, the buffer memory 1440 can achieve accurate performances and provide a sufficient process margin. Consequently, stability of the memory system 1400 can be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. An electronic device comprising a semiconductor memory unit which comprises:
    a plurality of storage cells each comprising a variable resistance element of which resistance value changes with a current flowing across the variable resistance element and a selecting element coupled to one end of the variable resistance element;
    a plurality of word lines, each coupled to a selecting element of a corresponding storage cell of the plurality of storage cells;
    a first line coupled to one ends of the plurality of storage cells;
    a second line coupled to the other ends of the plurality of storage cells;
    a voltage adjuster configured to adjust the voltage levels of back bias voltages of the selecting elements of the plurality of storage cells in accordance with a temperature change;
    an access control unit electrically coupled to the first and second lines and providing a write current or a read current to a selected storage cell among the plurality of storage cells; and
    a word line control unit configured to adjust an activation voltage level applied to the selected word line in accordance with a temperature change,
    wherein when the decrease in resistance of the variable resistance element according to the increase of temperature is smaller than the sum of the increase in resistance of the selecting element according to the increase of temperature, the increase in resistance of the first line according to the increase of temperature, and the increase in resistance of the second line according to the increase of temperature, the write current and the read current decrease with the increase of temperature.

2. The electronic device of claim 1, wherein when the temperature increases,
    a switching current corresponding to a minimum current to change a state of the variable resistance element decreases, a resistance value of the variable resistance element decreases, resistance values of the selecting element, the first and second lines increase.

3. The electronic device of claim 1, wherein the voltage adjuster increases the back bias voltage level when the temperature increases during a write operation in case where the decrease of the switching current according to the increase of temperature is smaller than the decrease of the write current according to the increase of temperature,
    increases the back bias voltage level when the temperature decreases during the write operation in case where the decrease of the switching current according to the increase of temperature is larger than the decrease of the write current according to the decrease of temperature, and
    maintains the back bias voltage level at a set voltage level during the write operation in case where the decrease of the switching current according to the increase of temperature is equal to the decrease of the write current according to the increase of temperature.

4. The electronic device according to claim 3, wherein the word line control unit increases the activation voltage level when the temperature increases during a write operation in case where a decrease of the switching current according to the increase of temperature is smaller than a decrease of the write current according to the increase of temperature,
    decreases the activation voltage level when the temperature increase during the write operation in case where the decrease of the switching current according to the increase of temperature is larger than the decrease of the write current according to the decrease of temperature, and
    maintains the activation voltage level at a set voltage level during the write operation in case where the decrease of the switching current according to the increase of temperature is equal to the decrease of the write current according to the increase of temperature.

5. The electronic device according to claim 4, wherein the voltage adjuster increases the back bias voltage level when the temperature increases during a read operation, and wherein the word line control unit increases the activation voltage level when the temperature increases during a read operation.

6. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that includes the variable resistance element is part of the cache memory unit in the processor.

7. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

8. The electronic device according to claim 1, wherein when the decrease in resistance of the variable resistance element according to the increase of temperature is larger than the sum of the increase in resistance of the selecting element according to the increase of temperature, the increase in resistance of the first line according to the increase of temperature, and the increase in resistance of the second line according to the increase of temperature, the write current and the read current increase with the increase of temperature, wherein the voltage adjuster increases the back bias voltage level with the decrease of temperature, wherein the word line control unit increases the activation voltage level with the decrease of temperature.

9. The electronic device according to claim 1, wherein when the decrease in resistance of the variable resistance element according to the increase of temperature is equal to the sum of the increase in resistance of the selecting element according to the increase of temperature, the increase in resistance of the first line according to the increase of temperature, and the increase in resistance of the second line according to the increase of temperature, the write current and the read current are maintained at set values, wherein the voltage adjuster increases the back bias voltage level when the temperature decreases during a write operation, and maintains the back bias voltage level at a set voltage level during a read operation, wherein the word line control unit increases the activation voltage level when the temperature decreases during a write operation, and maintains the activation voltage level at a set voltage level during a read operation.

10. An electronic device comprising a semiconductor memory unit which comprises:

a first global line;

a second global line;

a plurality of cell arrays each including a plurality of storage cells including a selecting element, a variable resistance element of which resistance changes based on a current flowing across the variable resistance element, a first line coupled to one ends of the plurality of storage cells, and a second line coupled to the other ends of the plurality of storage cells;

a plurality of word lines, each coupled to a selecting element of a corresponding storage cell;

a plurality of first transistors connected to the first global line and the respective cell arrays;

a plurality of second transistors connected to the second global line and the respective cell arrays;

a voltage adjuster configured to adjust the voltage levels of back bias voltages applied to the selecting elements, the plurality of first transistors, and the plurality of second transistors in accordance with a temperature change;

an access control unit configured to provide a write current or a read current to a selected storage cell among the plurality of storage cells, and a word line control unit configured to adjust an activation voltage level applied to the selected word line in accordance with a temperature change, wherein, when a decrease in resistance of the variable resistance element according to an increase of temperature is smaller than a sum of an increase in resistance of the selecting element according to the increase of temperature, an increase in resistance of the first transistors according to the increase of temperature, an increase in resistance of the second transistors according to the increase of temperature, an increase in resistance of the first line according to the increase of temperature, an increase in resistance of the second line according to the increase of temperature, an increase in resistance of the first global line according to the increase of temperature, and an increase in resistance of the second global line according to the increase of temperature, the write current and the read current decrease with the increase of temperature, wherein the voltage adjuster increases the back bias voltage level with a decrease of temperature, and wherein the word line control unit increases the activation voltage level with the decrease of temperature.

11. An electronic device comprising a semiconductor memory unit which comprises:

a first global line;

a second global line;

a plurality of cell arrays each including a plurality of storage cells including a selecting element, a variable resistance element of which resistance changes based on a current flowing across the variable resistance element, a first line coupled to one ends of the plurality of storage cells, and a second line coupled to the other ends of the plurality of storage cells;

a plurality of word lines, each coupled to a selecting element of a corresponding storage cell;

a plurality of first transistors connected to the first global line and the respective cell arrays;

a plurality of second transistors connected to the second global line and the respective cell arrays;

a voltage adjuster configured to adjust the voltage levels of back bias voltages applied to the selecting elements, the plurality of first transistors, and the plurality of second transistors in accordance with a temperature change;

an access control unit configured to provide a write current or a read current to a selected storage cell among the plurality of storage cells, and a word line control unit configured to adjust an activation voltage level applied to the selected word line in accordance with a temperature change, when a decrease in resistance of the variable resistance element according to an increase of temperature is equal to a sum of the increase in resistance of the selecting element according to the increase of temperature, an increase in resistance of the first transistors according to the increase of temperature, an increase in resistance of the second transistors according to the increase of temperature, an increase in resistance of the first line according to the increase of temperature, an increase in resistance of the second line according to the increase of temperature, an increase in resistance of the first global line according to the increase of temperature, and an increase in resistance of the second global line according to the increase of temperature, the write current and the read current are maintained at set values, wherein the voltage adjuster increases the back bias voltage level with a decrease of temperature, wherein the word line control unit increases the activation voltage level with the decrease of temperature.

12. An electronic device comprising a semiconductor memory unit which comprises:
a plurality of storage cells each comprising a variable resistance element of which resistance value changes with a current flowing across the variable resistance element and a selecting element coupled to one end of the variable resistance element;
a plurality of word lines, each coupled to a selecting element of a corresponding storage cell of the plurality of storage cells;
a first line coupled to one ends of the plurality of storage cells;
a second line coupled to the other ends of the plurality of storage cells;
a voltage adjuster configured to adjust the voltage levels of back bias voltages of the selecting elements of the plurality of storage cells in accordance with a temperature change;
an access control unit electrically coupled to the first and second lines and providing a write current or a read current to a selected storage cell among the plurality of storage cells; and
a word line control unit configured to adjust an activation voltage level applied to the selected word line in accordance with a temperature change, and
wherein, when a decrease in resistance of the variable resistance element according to an increase of temperature is smaller than a sum of an increase in resistance of the selecting element according to the increase of temperature, an increase in resistance of the first transistors according to the increase of temperature, an increase in resistance of the second transistors according to the increase of temperature, an increase in resistance of the first line according to the increase of temperature, an increase in resistance of the second line according to the increase of temperature, an increase in resistance of the first global line according to the increase of temperature, and an increase in resistance of the second global line according to the increase of temperature, the write current and the read current decrease with the increase of temperature.

13. The electronic device of claim 12, wherein the voltage adjuster increases the back bias voltage level when the temperature increases during a write operation in case where the decrease of the switching current according to the increase of temperature is smaller than the decrease of the write current according to the increase of temperature,
increases the back bias voltage level when the temperature decreases during the write operation in case where the decrease of the switching current according to the increase of temperature is larger than the decrease of the write current according to the decrease of temperature, and
maintains the back bias voltage level at a set voltage level during the write operation in case where the decrease of the switching current according to the increase of temperature is equal to the decrease of the write current according to the increase of temperature.

14. The electronic device of claim 13, wherein the word line control unit increases the activation voltage level when the temperature increases during a write operation in case where the decrease of the switching current according to the increase of temperature is smaller than the decrease of the write current according to the increase of temperature,
increases the activation voltage level when the temperature decreases during the write operation in case where the decrease of the switching current according to the increase of temperature is larger than the decrease of the write current according to the decrease of temperature, and
maintains the activation voltage level at a set voltage level during the write operation in case where the decrease of the switching current according to the increase of temperature is equal to the decrease of the write current according to the increase of temperature variable resistance element.

15. The electronic device of claim 14, wherein the voltage adjuster increases the back bias voltage level when the temperature increases during a read operation, wherein the word line control unit increases the activation voltage level when the temperature increases during a read operation.

16. The electronic device according to claim 15, further include a select signal generator configured to generate a plurality of select signals corresponding to the respective cell arrays, activate one or more of the plurality of select signals, and adjust the voltage levels of the activated select signals according to the temperature,
wherein the select signal generator increases the voltage level of the activated select signal when the temperature decreases during the write operation in case where the decrease of the switching current according to the increase of temperature is larger than the decrease of the write current according to the increase of temperature.

17. The electronic device according to claim 15, further include a select signal generator configured to generate a plurality of select signals corresponding to the respective cell arrays, activate one or more of the plurality of select signals, and adjust the voltage levels of the activated select signals according to the temperature,
wherein the select signal generator maintains the voltage level of the activated select signal at a set level during the write operation in case where the decrease of the switching current according to the increase of temperature is equal to the decrease of the write current according to the increase of temperature.

18. The electronic device according to claim 13, further include a select signal generator configured to generate a plurality of select signals corresponding to the respective cell arrays, activate one or more of the plurality of select signals, and adjust the voltage levels of the activated select signals according to the temperature,
wherein the select signal generator increases the voltage level of the activated select signal when the temperature increases during a write operation in case where the decrease of the switching current according to the increase of temperature is smaller than the decrease of the write current according to the increase of temperature.

* * * * *